United States Patent [19]
Kaneko

[11] Patent Number: 5,942,773
[45] Date of Patent: Aug. 24, 1999

[54] FIELD EFFECT TRANSISTOR WITH REDUCED DELAY VARIATION

[75] Inventor: Yoshiaki Kaneko, Kawasaki, Japan

[73] Assignee: Fujitsu Limited, Kawasaki, Japan

[21] Appl. No.: 08/779,958

[22] Filed: Dec. 23, 1996

[30] Foreign Application Priority Data

Jun. 4, 1996 [JP] Japan ................................. 8-141848

[51] Int. Cl.$^6$ ....................... H01L 31/0328; H01L 29/00; H01L 29/76
[52] U.S. Cl. ......................... 257/280; 257/192; 257/408
[58] Field of Search .................... 257/192, 194, 257/279, 280, 284, 285, 408

[56] References Cited

U.S. PATENT DOCUMENTS 5,324,969   6/1994   Murai et al. ............................ 257/279

FOREIGN PATENT DOCUMENTS

| 58-56471 | 4/1983 | Japan . | |
|---|---|---|---|
| 58-123753 | 7/1983 | Japan . | |
| 3-104239 | 5/1991 | Japan . | |
| 0427153 | 1/1992 | Japan . | 257/280 |
| 7-14989 | 1/1995 | Japan . | |

OTHER PUBLICATIONS

Kimura et al., "Schottky Characteristics of Subhalf–Micron Gate Gaas Metal–Semiconductor Field–Effect Transistor", Japanese Journal of Applied Physics, vol. 32, No. 2A, Part 2, Feb. 1, 1993, pp. L183–L186.

"A –p–Well GaAs MESFET Technology for Mixed–Mode Applications," Canfield et al., IEEE Journal of Solid–State Circuits, vol. 25, No. 6, Dec. 1990, pp. 1544–1549.

"Elimination of Sidegating in N–Channel GaAs MESFET's Using a P–Type Well[1]," Canfield et al., GaAs IC Symposium, pp. 237–240.

"Trap Effects in p–Channel GaAs MESFET's," Peng et al., IEEE Transactions on Electron Devices, vol. 39, No. 11, Nov. 1992, pp. 2444–2451.

*Primary Examiner*—Wael M. Fahmy
*Attorney, Agent, or Firm*—Nikaido, Marmelstein, Murray & Oram LLP

[57] ABSTRACT

A field effect transistor with a reduced delay variation is provided in a compound semiconductor layer with a channel, a source, and a drain region of a first conduction type. A gate electrode, a source electrode, and a drain electrode are formed respectively on the regions mentioned above. Particularly the gate electrode formed on the channel is provided with a projecting part extended in a direction crossing the direction of opposition of the source and drain region and caused to protrude from the channel region. In the compound semiconductor layer, a well region of a second conduction type opposite to the first conduction type is formed so as to enclose the channel region, the source region, the drain region, and the projecting part of the gate electrode more deeply than in the channel, source, and drain regions. The delay variation is markedly reduced by the fact that the gate electrode including the projecting part is enclosed with the well region of the second conduction type.

19 Claims, 21 Drawing Sheets

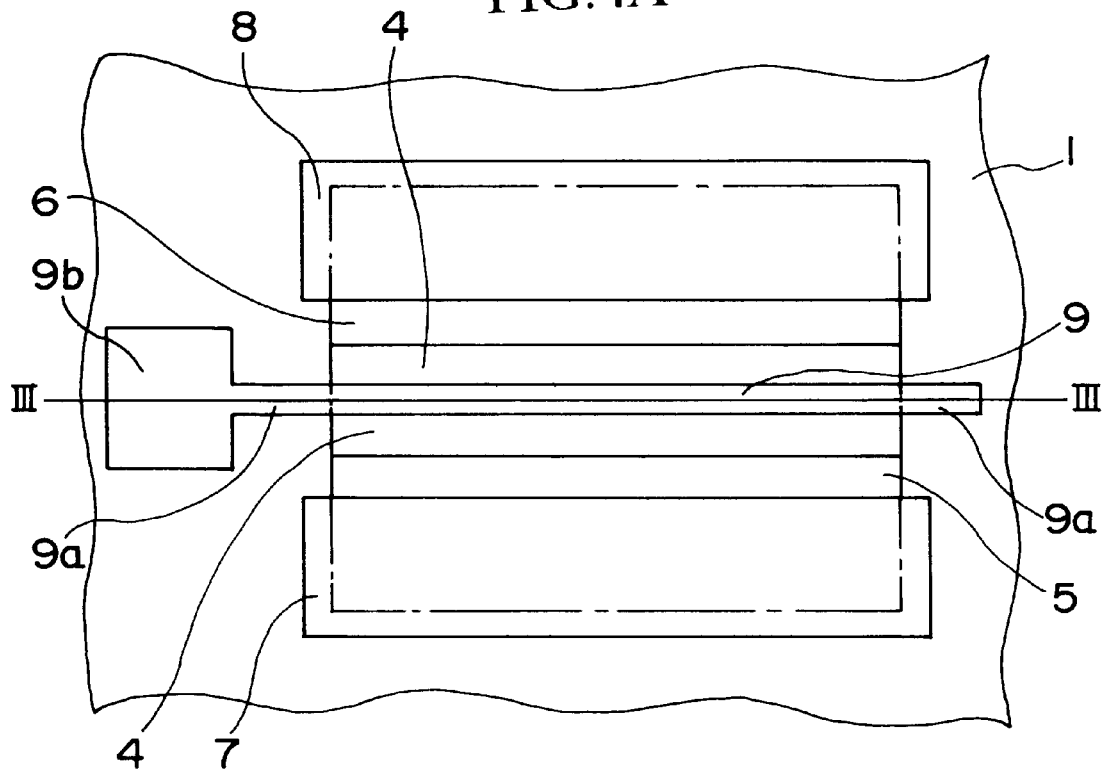
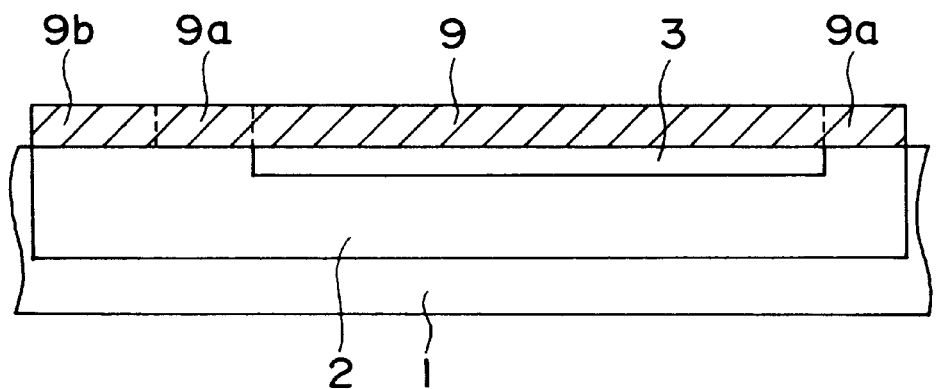

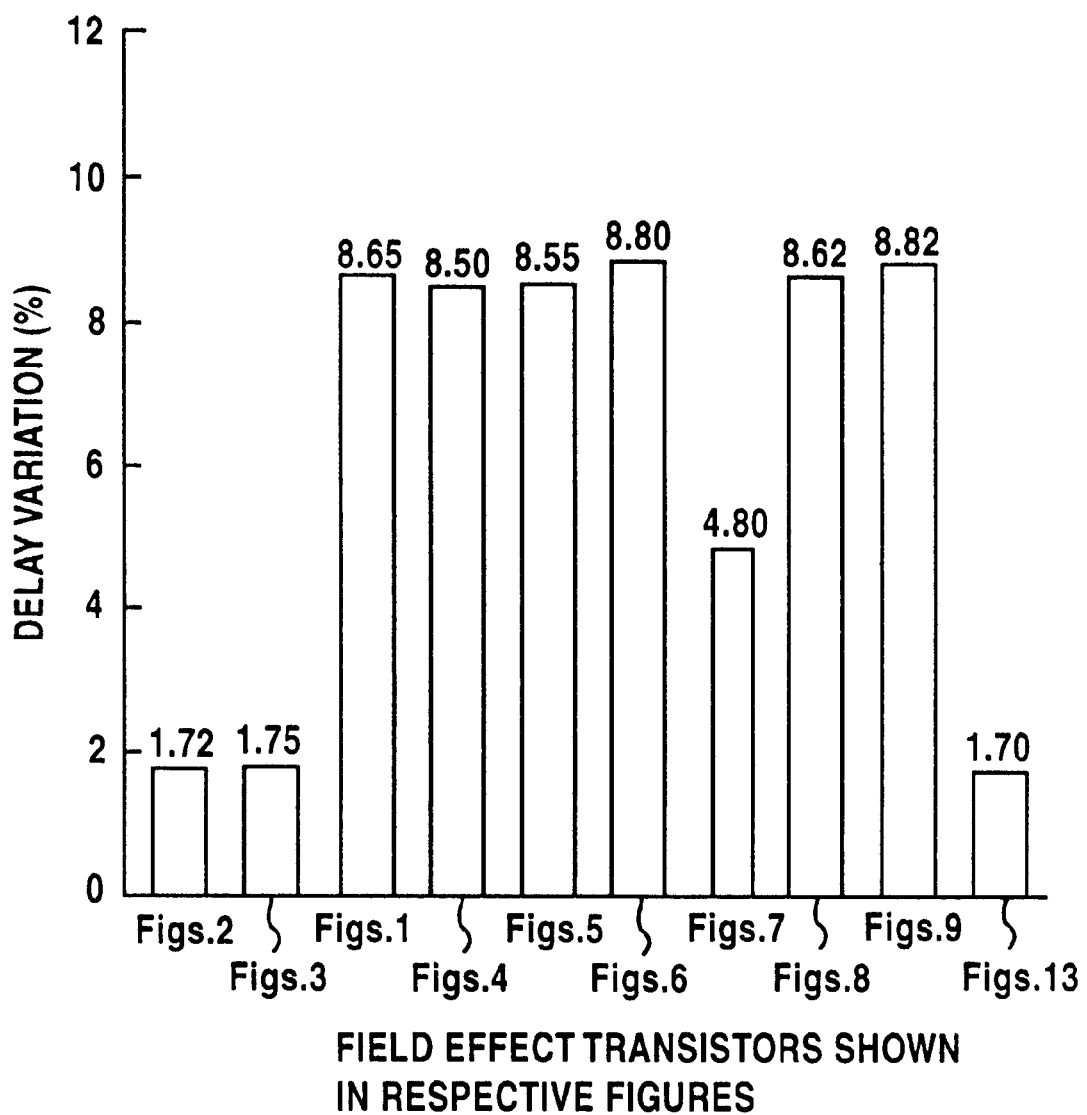

Evaluation Circuit

Time Results   Variation of Output Timing Measurements

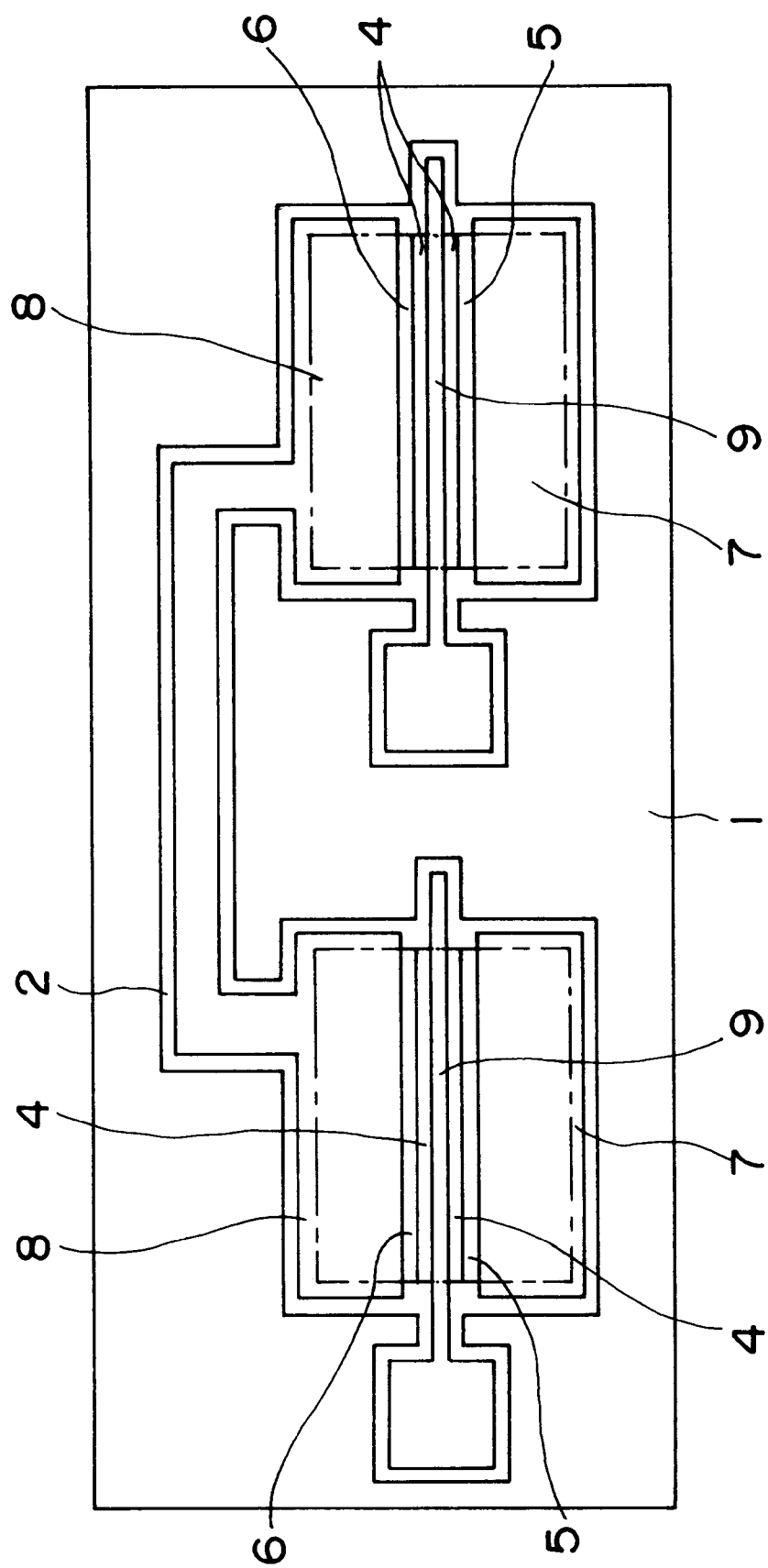

FIELD EFFECT TRANSISTOR WITH REDUCED DELAY VARIATION

BACKGROUND OF THE INVENTION

1. Field of the Invention

This invention relates to a field effect transistor using a Group III-V compound semiconductor and more particularly to a field effect transistor fit for the configuration of a logic circuit.

In the recent data processing field, devices which are capable of faster logic motions have been in demand. The feasibility of substituting field effect transistors using compound semiconductors (such as, for example, GaAs) for the silicon devices has been under study.

In the case of compound semiconductor devices (such as, for example, microwave grade field effect transistors and HEMT) which are used in amplifiers as in portable telephones, further integration of logic parts necessitates logic grade field effect transistors using a compound semiconductor.

2. Description of the Prior Art

FIG. 1 is a diagram illustrating a conventional field effect transistor using a compound semiconductor; part A represents a plane view and part B represents a cross section taken through part A along the line XX—XX.

In the diagram, 101 denotes a compound semiconductor layer which, in the illustrated case, is formed of semi-insulating GaAs. Incidentally, the compound semiconductor layer 101 refers at times to what is formed on a substrate made of a compound semiconductor and at other times to what constitutes itself a compound semiconductor substrate. Numeral 102 denotes a well region which has incorporated a p type impurity therein. Numeral 103 is denotes a channel region which has incorporated an n type impurity therein. Numeral 104 is an LDD region which has incorporated an n type impurity therein at a higher concentration than in the channel region. 105 is denotes a source region and 106 denotes a drain region, which both have incorporated an n type impurity therein at a higher concentration than the LDD region 104. 107 is a source electrode and 108 is a drain electrode, which both are ohmically connected respectively to the source and the drain region. 109 is a gate electrode which is kept in Schottky contact with the upper side of the channel region 103.

As is clear from FIG. 1A, the gate electrode 109 is provided with a projecting part 109a. This projecting part 109a is furnished for this transistor for the following reason. Between the source and the drain electrode 107 and 108, the compound semiconductor layer (semi-insulating GaAs layer) 101 along or outside the boundaries of these regions has formed therein a fine channel through which carriers are travelling, thus generating a short channel effect besides the channel region 103 containing an n type impurity. The projecting part 109a formed by extending the gate electrode 109 onto the compound semiconductor layer 101, therefore, is expected to exert a gate field on the carriers travelling through the fine channel and consequently suppress the generation of the short channel effect.

The gate electrode 109 is further provided with a gate pad part 109b, to which are connected necessary wires.

The well region 102 has a conductivity opposite to that of the channel region 103 and, due to the pn junction thereof with the channel region 103, serves to preclude the possibility of carriers leaking from the channel region 103 to the compound semiconductor layer 101 and reducing the short channel effect.

The field effect transistor which is formed of such compound semiconductors as mentioned above promises to find utility in high-speed arithmetic operations because the speed of travel of carriers in the crystal is markedly high as compared with a silicon device.

The field effect transistor using compound semiconductors, though capable of high-speed operations as mentioned above, has the problem of suffering the static properties thereof to vary particularly at a low frequency.

Specifically, this transistor induces dispersion in drain current, transconductance, and drain conductance in a low frequency zone and, as a result, disperses the point of change of the transistor operation (the timing for the high-low or the low-high change). This dispersion is called as "delay variation."

This problem is especially serious in the logic circuit. This is because the elements forming the logic circuit cannot execute logical operations with expected accuracy unless the point of change mentioned above is constant. Usually, the delay variation is allayed by enlarging the timing margin of the logical operations. This measure results in exerting an extra timing margin on the circuit operations and consequently posing the problem of preventing the field effect transistor using compound semiconductors from fulfilling the inherent property, namely high-speed operations.

This delay variation is a phenomenon that is peculiar to the use of a compound semiconductor. The delay variation in fact does not occur when crystals made of a single element are used as in the silicon devices. The addition of the margin in due respect of the delay variation to the design of a logical circuit is a problem that is peculiar to the field effect transistor using compound semiconductors.

SUMMARY OF THE INVENTION

It is an object of the present invention to solve the problems mentioned above and develop a field effect transistor with the delay variation thereof reduced to the fullest possible extent.

The present inventor, prior to starting a study in search of the cause for delay variation, formed a theory that the main cause for the delay variation resides not in a channel region that allows substantial travel of carriers but outside a region that is defined as a channel region and performed various tests on this theory. The contents of these tests will be described in detail in the section "Description of Preferred Embodiments" to be given hereinafter. From the results of the tests, the present inventor has found that the delay variation is notably reduced by forming a well region in a compound semiconductor layer so as to enclose therewith a projecting part of a gate electrode. The objects of this invention mentioned above are now accomplished by configuring a field effect transistor which is provided with this well region.

The present invention further allows a field effect transistor with more reduced delay variation to be obtained by forming the well region in such a manner as to enclose the parts of the source and drain electrodes which protrude from the source and drain regions. The field effect transistor of the type which is provided with a gate pad part having a greater width than the gate electrode is enabled to repress the delay variation further by forming the well region in such a manner as to enclose this gate pad part.

The question of why the provision of the well region enclosing the projecting part of the gate electrode results in marked reduction of the delay variation has not yet been fully elucidated theoretically. The marked effect of this provision on the reduction of delay variation, however, has been confirmed by the inventor's tests.

BRIEF DESCRIPTION OF THE DRAWINGS

FIG. 4A is a plane view for explaining the construction of a first field effect transistor studied by way of comparison in the development of this invention and FIG. 4B is a cross section taken through FIG. 4A along the line III—III;

FIG. 10 is a diagram showing the results of a test for delay variation performed on field effect transistors of the constructions respectively of this invention, comparative design, and conventional design;

FIG. 14 is a plane view for explaining the construction of a field effect transistor according to the fifth embodiment of this invention;

DESCRIPTION OF PREFERRED EMBODIMENTS

Figure 2A:
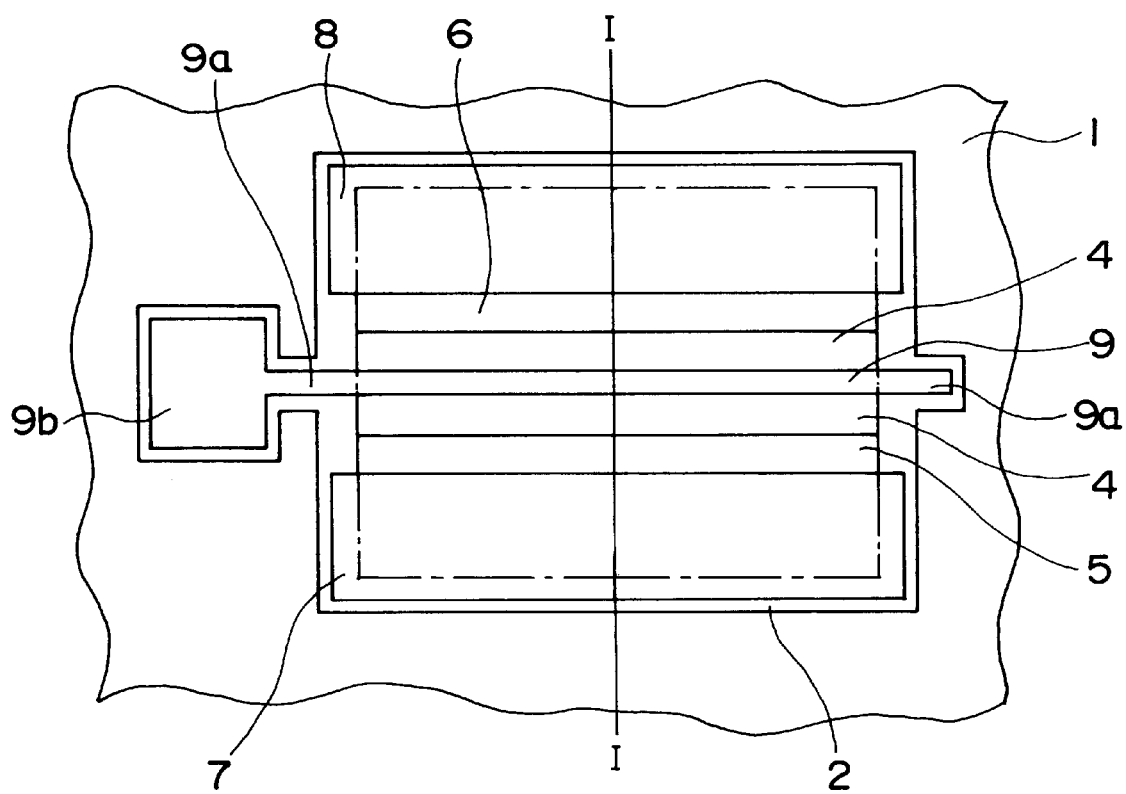
FIG. 2A is a plane view for explaining the construction of a field effect transistor according to the first embodiment of this invention and FIG. 2B is a cross section taken through FIG. 2A along the line I—I.
Figure 2B:
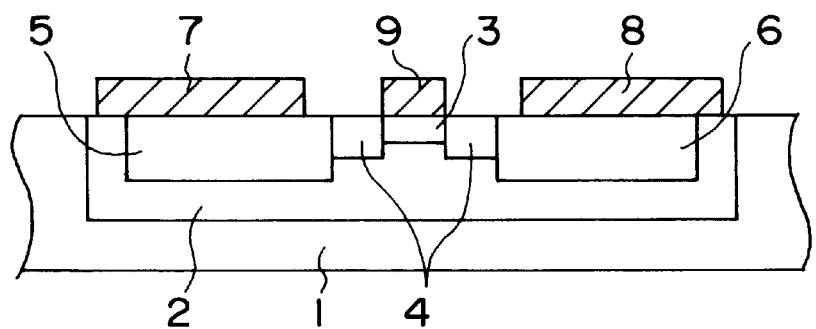

FIGS. 2A and 2B are, respectively, a plane view of a field effect transistor according to the first embodiment of this invention and a cross section taken through the plane view along the line I—I.

In the diagrams, 1 denotes a compound semiconductor layer which in the present case is formed of semi-insulating GaAs. The compound semiconductor layer 1 at times refers to what is formed on a substrate made of a compound semiconductor or at other times refers to what constitutes itself a compound semiconductor substrate. 2 denotes a well region having introduced a p type impurity, 3 for a channel region having introduced an n type impurity, 4 for an LDD region having introduced an n type impurity at a higher concentration than in the channel region, 5 for a source region and 6 for a drain region both having introduced an n type impurity at a higher concentration than in the LDD region 4, and 7 for a source electrode and 8 for a drain electrode both being ohmically connected respectively to the source and drain regions. The source and drain electrodes 7 and 8 are both formed past the boundaries of the source and drain regions 5 and 6. By 9 is denoted a gate electrode which is kept in Schottky contact with the upper sides of the source and drain regions 5 and 6. The gate electrode 9 is extended in a direction crossing the direction of opposition of the source and drain regions 5 and 6 and is provided with a projecting part 9a which protrudes from the channel region 3. Denoted by 9b is a gate pad part which is connected to one projecting part 9a.

In the present embodiment, the p type well region 2 is so shaped as to enclose therewith the channel region 3, the LDD region 4, the source and drain regions 5 and 6, the source and drain electrodes 7 and 8, and the projecting part 9a and the gate pad part 9b of the gate electrode 9 in the surface of the semiconductor layer 1 and along the depths thereof as well.

In the present embodiment, the delay variation can be curbed notably as compared with the conventional device by the provision of the well region 2 of the shape described above. The mechanism responsible for this reduction of the delay variation will be discussed with reference to the comparative and referential examples to be cited hereinafter.

Figure 3A:
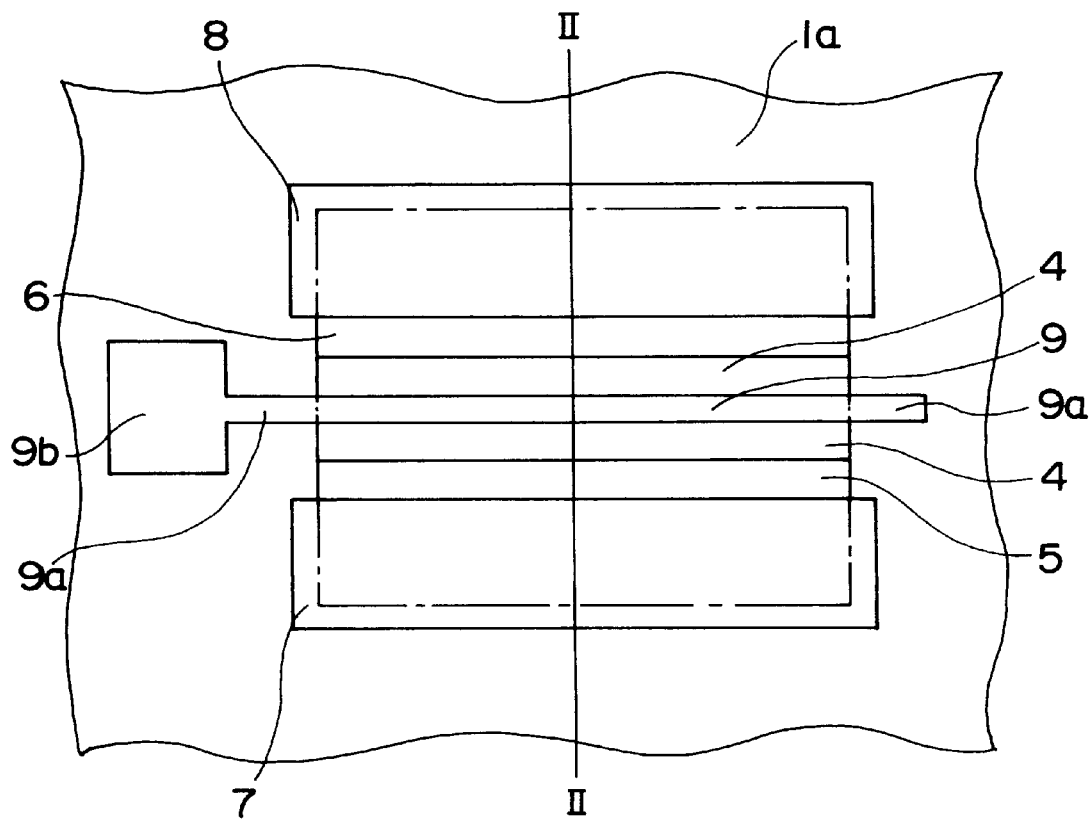
FIG. 3A is a plane view for explaining the construction of a field effect transistor according to the second embodiment of this invention and FIG. 3B is a cross section taken through FIG. 3A along the line II—II.
Figure 3B:
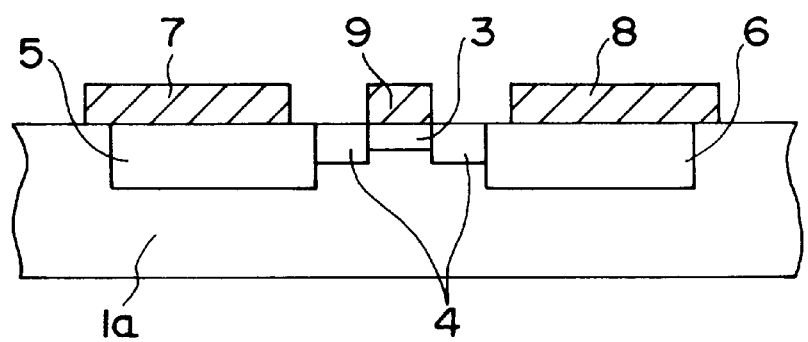

FIGS. 3A and 3B are respectively a plane view of a field effect transistor according to the second embodiment of this invention and a cross section taken through the plane view along the line II—II. In FIG. 3, like parts found in FIG. 2 are denoted by like referential numerals.

In the first embodiment illustrated in FIG. 2, the well region 2 is defined in the compound semiconductor layer 1. The second embodiment is characterized by imparting a conductivity type opposite to that of the source, drain, and channel regions to the compound semiconductor layer 1a for the purpose of enabling the layer 1a itself to function as a well region. Specifically, the compound semiconductor layer 1a has a p type conductivity type. The construction of the second embodiment in all the other respects, i.e. the channel region, the LDD region, the source and drain regions 5 and 6, the source and drain electrodes 7 and 8, the gate electrode 9, the projecting part 9a, and the gate pad part 9b, are identical with that of the first embodiment illustrated in FIG. 2.

This embodiment is capable of reducing the delay variation similarly to the first embodiment because the compound semiconductor layer 1a which functions as a well region is disposed on the outer side than the projecting part 9a of the gate electrode.

The present inventor, in an effort to obtain the optimum mode of embodying this invention, formed field effect transistors varied particularly in the construction of well region and tested them for delay variation.

FIG. 4 through FIG. 9 are diagrams illustrating the various transistor constructions studied and tested by the present inventor. In these diagrams, like parts found in FIGS. 2 and 3 are denoted by like reference numerals.

First, the construction of comparative study shown in FIG. 4, though identical in a plan layout shown in FIG. 4A with that of the conventional design shown in FIG. 1, has the well region 2 formed directly below the projecting part 9a of the gate electrode 9 as shown in FIG. 4B which is a cross section taken in the direction III—III of the gate electrode.

Figure 5A:
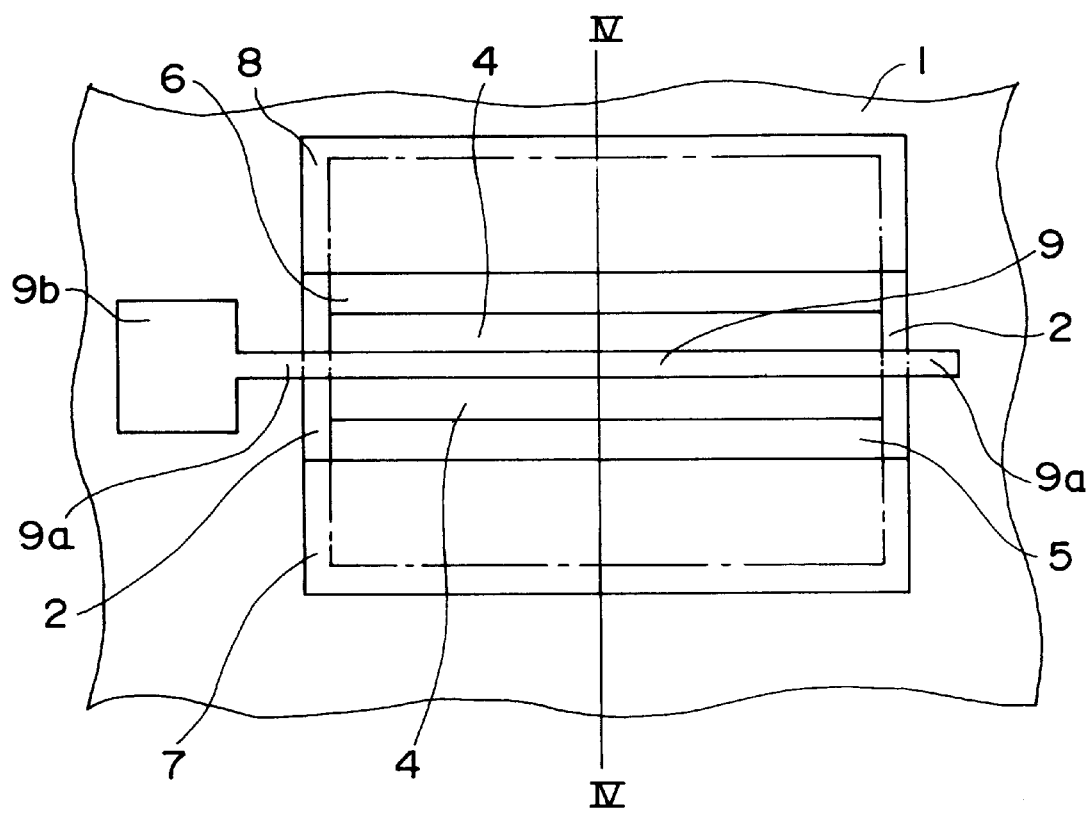
FIG. 5A is a plane view for explaining the construction of a second field effect transistor studied by way of comparison in the development of this invention and FIG. 5B is a cross section taken through FIG. 5A along the line IV—IV.
Figure 5B:
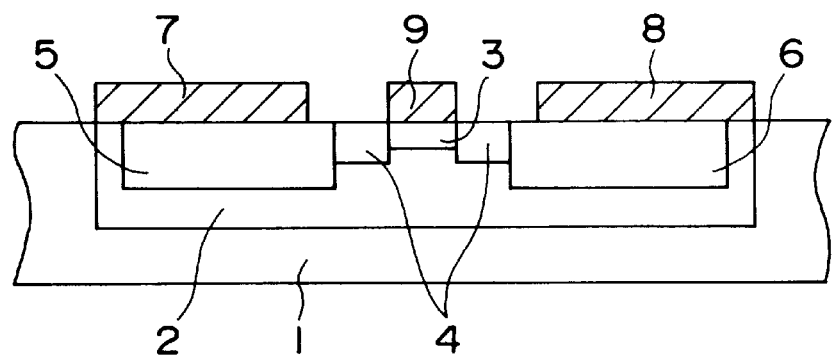

The construction of comparative study shown in FIG. 5 has the well region 2 formed directly below the source electrode and the drain electrode 8. While the conventional construction of FIG. 1 has the source electrode 7 and the drain electrode 8 partly kept in contact with the compound semiconductor layer 1 outside the source region 5 and the drain region 6, the construction of FIG. 5 has the well region 2 formed so as to include these parts. FIG. 5A is a plane view of this field effect transistor and FIG. 5B is a cross section taken through FIG. 5A along the line IV—IV.

Figure 6A:
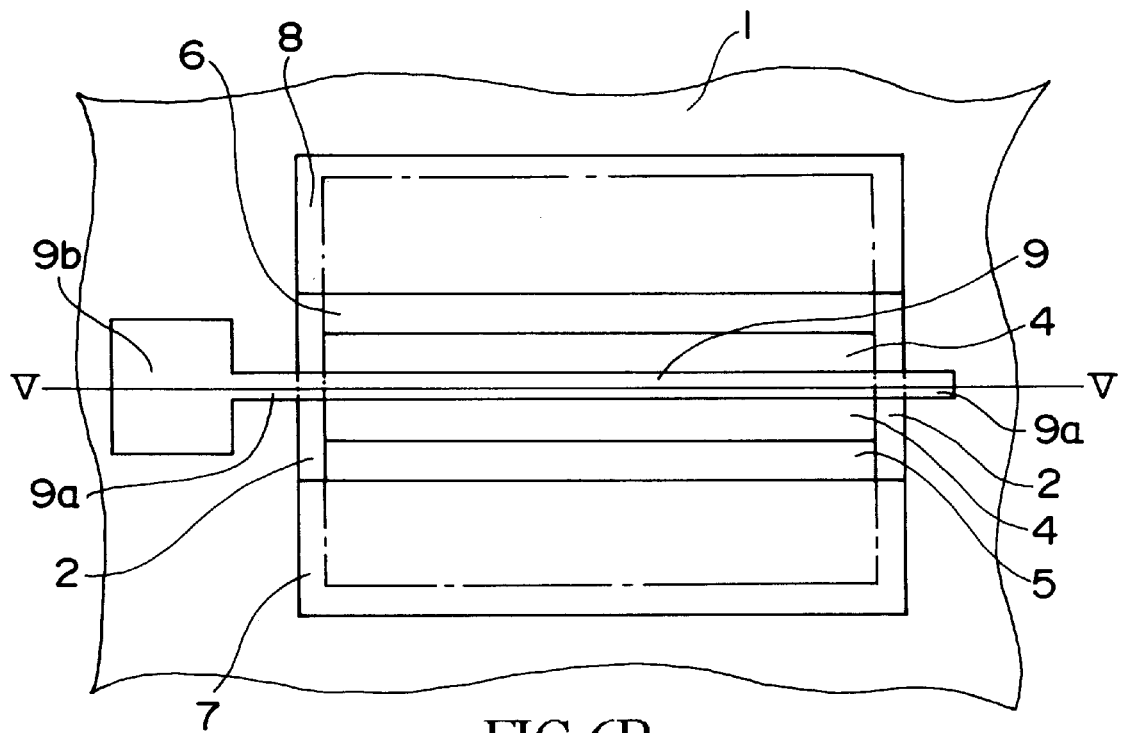
FIG. 6A is a plane view for explaining the construction of a third field effect transistor studied by way of comparison in the development of this invention and FIG. 6B is a cross section taken through FIG. 6A along the line V—V.
Figure 6B:
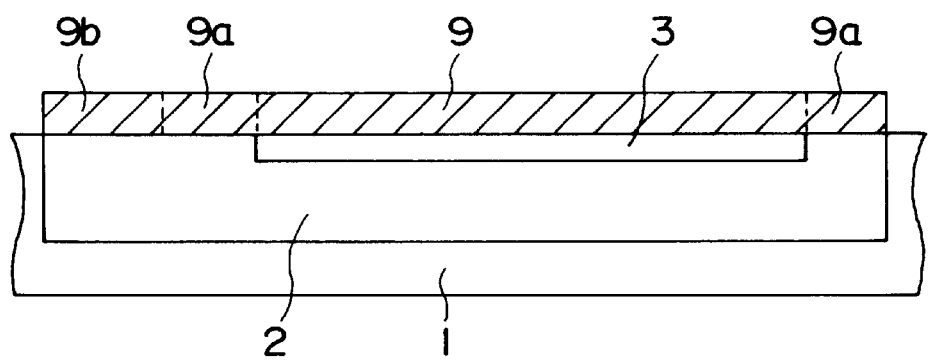

Then, FIG. 6 depicts a construction which embraces the constructions of the well region 2 shown in FIG. 4 and FIG. 5. In summary, this construction has the channel region 2 so disposed as to be extended to directly below the projecting part 9a of the gate electrode 9, the source electrode 7, and the drain electrode 8. FIG. 6A is a plane view of this field effect transistor and FIG. 6B is a cross section taken through FIG. 6A along the line V—V.

Figure 7A:
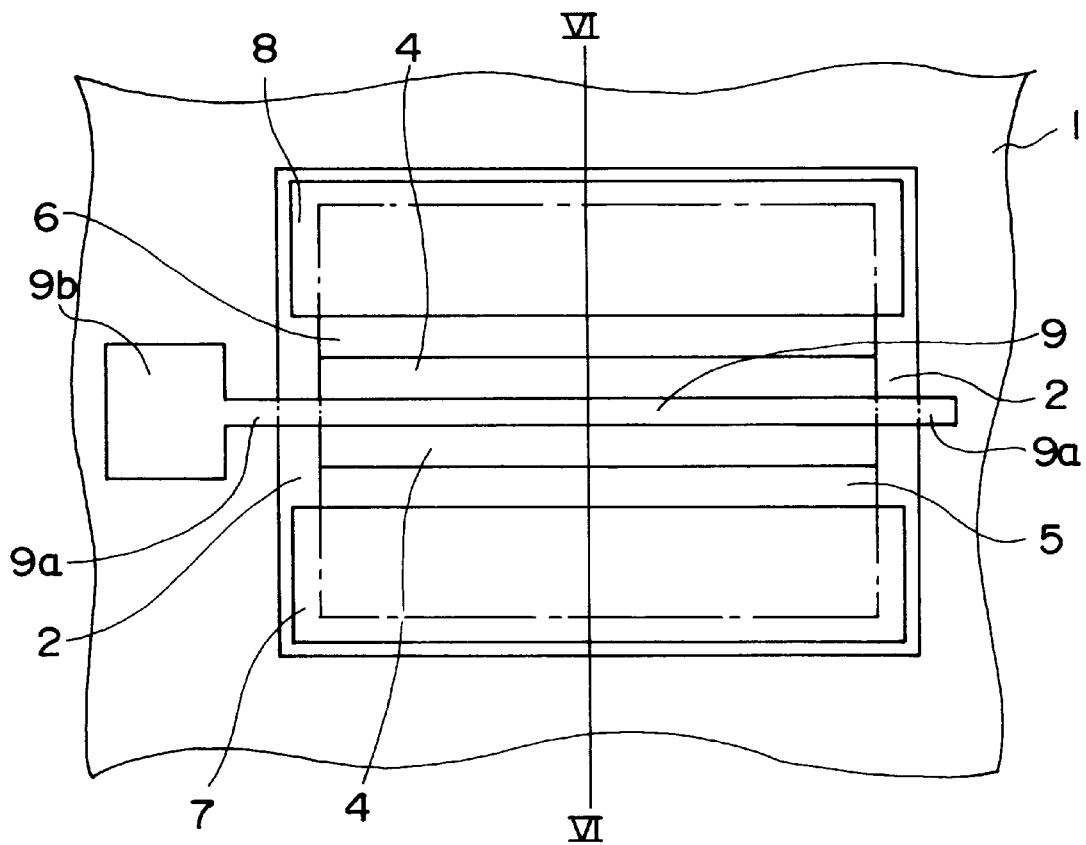
FIG. 7A is a plane view for explaining the construction of a fourth field effect transistor studied by way of comparison in the development of this invention and FIG. 7B is a cross section taken through FIG. 7A along the line VI—VI.
Figure 7B:
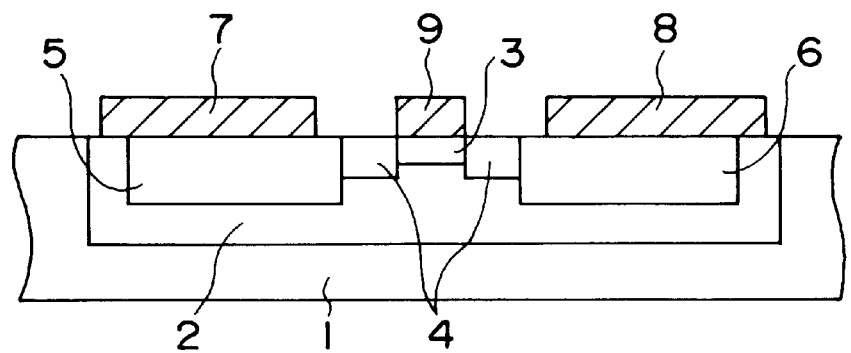

Then, the construction of FIG. 7 resembles that of FIG. 5. While the construction of FIG. 5 has the well region 2 formed only directly below the source electrode 7 and the drain electrode 8, the present construction has the well region 2 formed as expanded even to include the outsides of the source electrode 7 and the drain electrode 8. FIG. 7A is a plane view of this field effect transistor and FIG. 7B is a cross section taken through FIG. 7A along the line VI—VI.

Figure 8A:
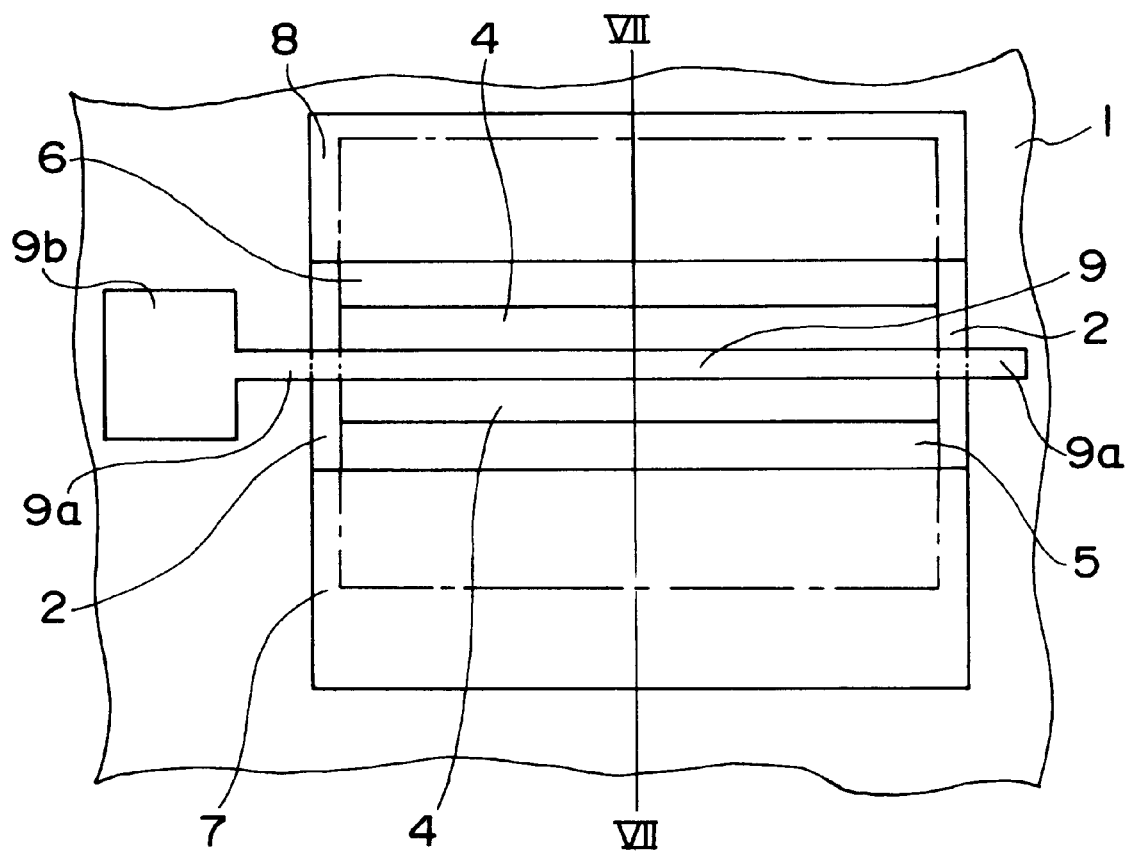
FIG. 8A is a plane view for explaining the construction of a fifth field effect transistor studied by way of comparison in the development of this invention and FIG. 8B is a cross section taken through FIG. 8A along the line VII—VII.
Figure 8B:
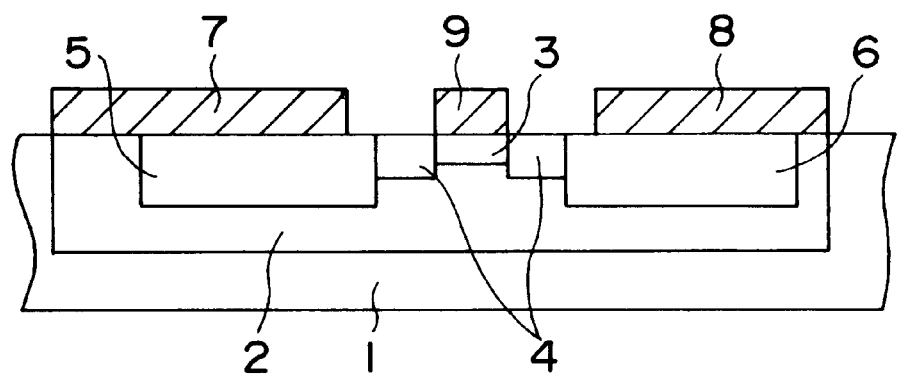

The construction of FIG. 8, though resembling that of FIG. 5, allows the contact region between the source electrode 7 and the well region 2 which is retained at a prescribed potential to be enlarged as compared with the construction of FIG. 5. This construction can be expected to further stabilize the potential of the well region 2. FIG. 8A is a plane view of this field effect transistor and FIG. 8B is a cross section taken through FIG. 8A along the line VII—VII.

Figure 9A:
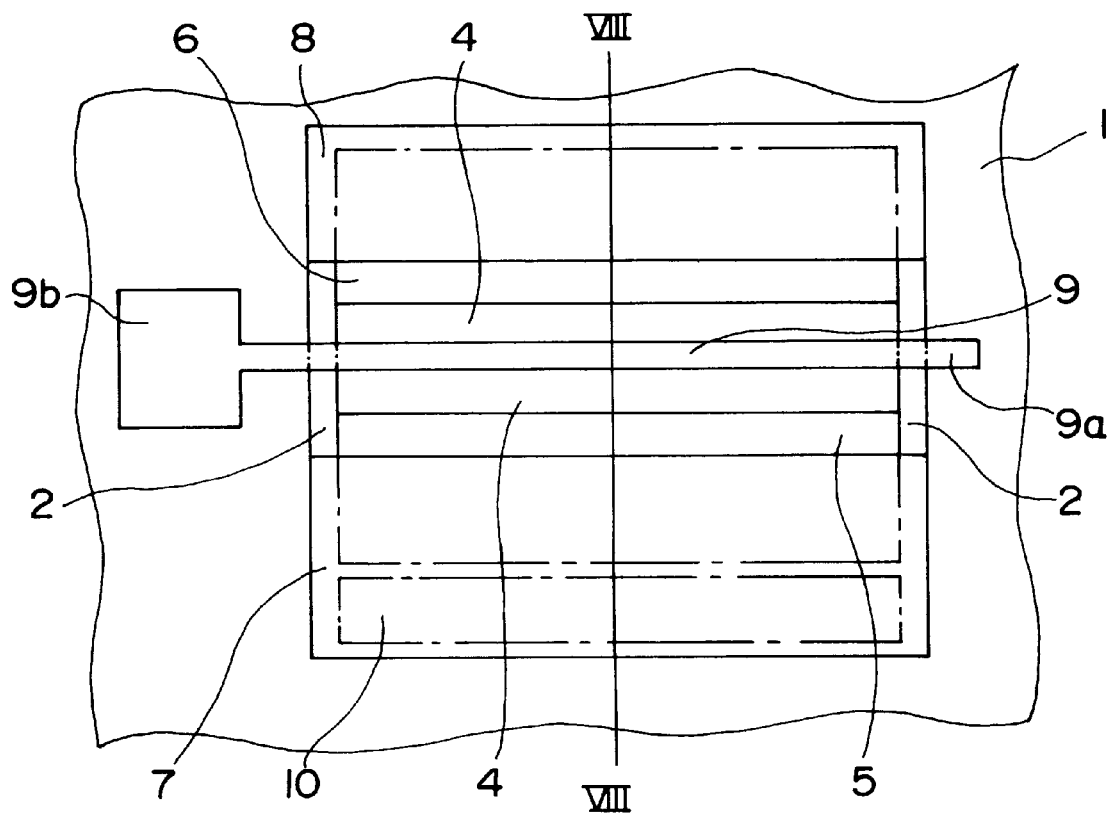
FIG. 9A is a plane view for explaining the construction of a sixth field effect transistor studied by way of comparison in the development of this invention and FIG. 9B is a cross section taken through FIG. 9A along the line VIII—VIII.
Figure 9B:
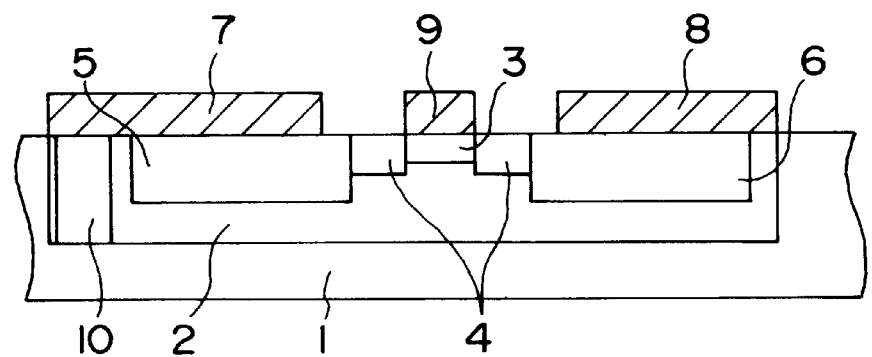

The construction of FIG. 9 resembles that of FIG. 8 and nevertheless differs therefrom in respect that it is provided with a contact region 10 of a high concentration for the purpose of allaying the contact resistance between the well region 2 and the source electrode 7. FIG. 9A is a plane view of this field effect transistor and FIG. 9B is a cross section taken through FIG. 9A along the line VIII—VIII.

Figure 1A:
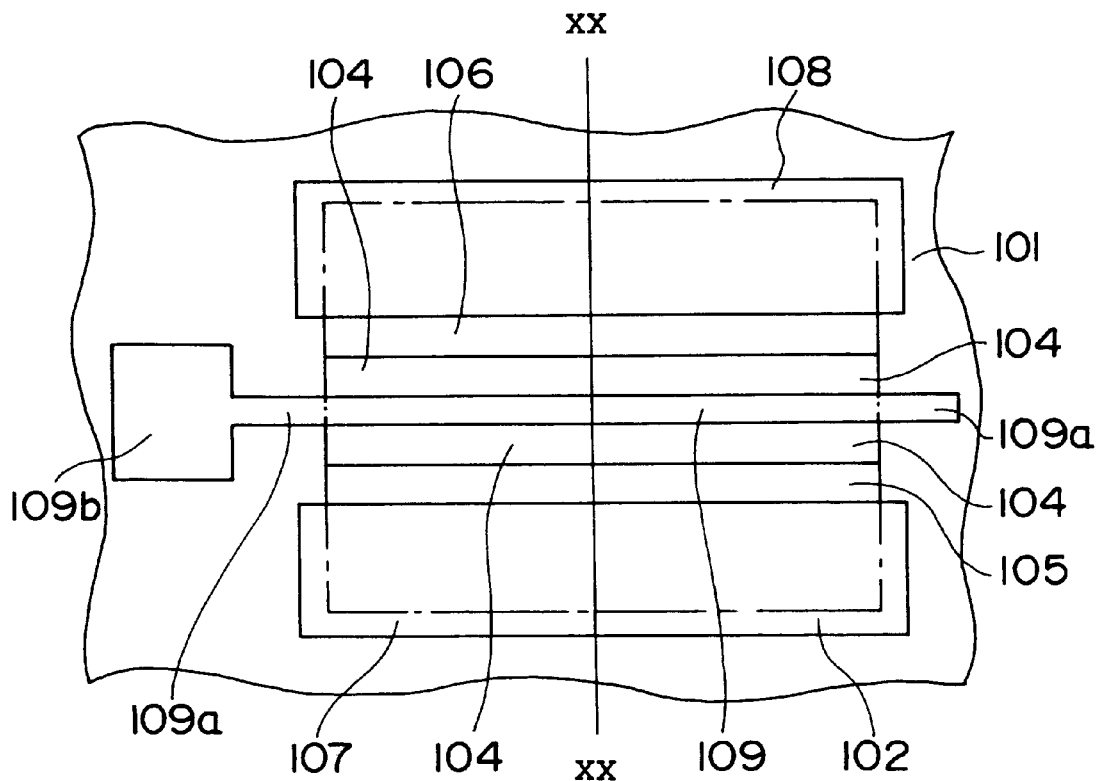
FIG. 1A is a plane view illustrating the construction of a conventional field effect transistor and FIG. 1B is a cross section taken through FIG. 1A along the line XX—XX.
Figure 1B:
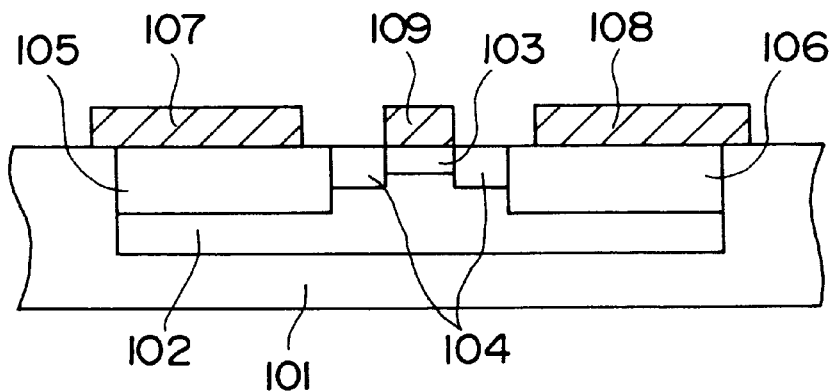

FIG. 10 shows the results of a determination of delay variation performed on the constructions of FIGS. 2 and 3 according to this invention, the conventional construction of FIG. 1, and the constructions of FIG. 4 through FIG. 9 studied by the present inventor.

Figure 11A:
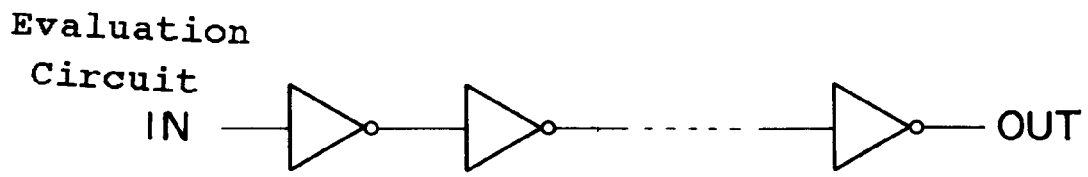
FIG. 11A depicting a circuit for the determination, FIG. 11B a timing chart for the determination, and FIG. 11C the results of determination of timing.

The results of determination shown in FIG. 10 were obtained as follows. A plurality (about 100, for example) of inverters each formed of field effect transistors of a given construction were connected in series as illustrated in FIG. 11 and the delay between an input pulse (IN) and an output pulse (OUT) was measured. This measurement of the amount of this delay was carried out, with the cycle of the input pulse varied. In the inventor's experiment, the width of the output pulse OUT was kept under observation with the width of the input pulse IN fixed at 10 ns and the cycle varied at several steps between 20 ns and 40.96 $\mu$s (Timing Measurement). The values of delay variation shown in FIG. 10 were found by calculating the ratios of the amounts of delay at the cycle of 20 ns and the amounts of delay at the cycle of 40.96 $\mu$s.

Figure 11B:
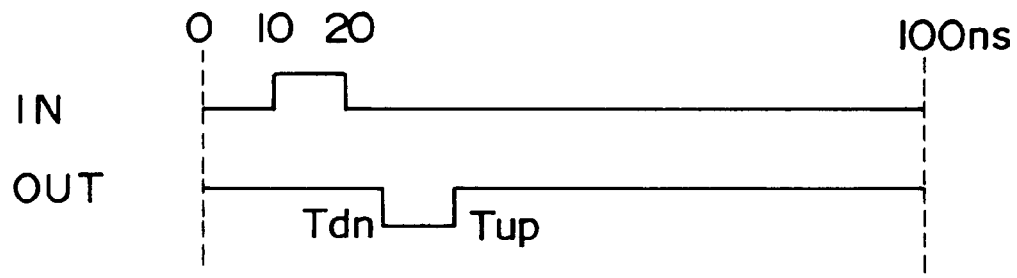
FIG. 11 are views illustrating a method for determination used for obtaining the graph of delay variation shown in FIG. 10.
Figure 11C:
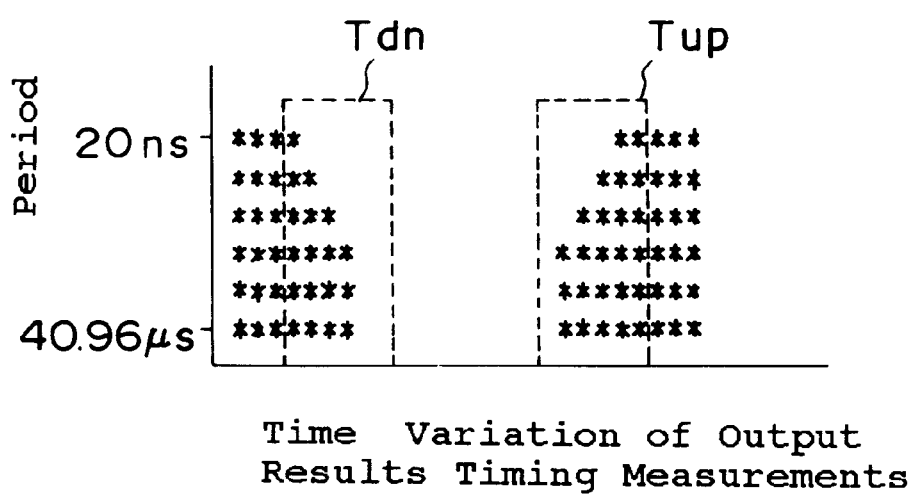

Now, the actual method for calculating delay variations will be described briefly below. FIG. 11B represents a timing chart of the input pulse IN and the output pulse OUT. The data of this timing chart are those obtained for the pulse cycle of 100 ns. For the input pulse IN of the width of 10 ns, the timings of the leading edge Tdn and the trailing edge Tup of the output pulse OUT are measured. This measurement is carried out with the cycle of the input pulse IN varied. FIG. 11C shows the results of the measurement of the timings. The star (*) mark in the diagram indicates that the relevant output is on the high (H) level. Thus, the Tdn is detected at the point at which the output level changes from H to L (low, the part devoid of the star * mark) and Tup is detected at the point at which the output level changes from L to H.

In FIG. 11C, the vertical axis is the scale of the cycle of the input pulse IN, indicating that the measurement is carried out at several steps of the cycle from 40.96 $\mu$s to 20 ns. The determination of the delay variation ($\Delta$ mark) is started by calculating the amount of variation of the timing at the leading edge Tdn of the output pulse in accordance with the formula (1) and then finding the amount of variation of the timing at the trailing edge Tup of the output pulse in accordance with the formula (2). The delay variation ($\Delta$ mark) is defined by the formula (3). The results of FIG. 10 represent in percent the values found in accordance with the formula (3).

$$\text{(Amount of variation at } Tdn) = \frac{(Tdn - 10 \text{ ns}) \text{ at } 40.96 \text{ }\mu s}{(Tdn - 10 \text{ ns}) \text{ at } 20 \text{ ns}} - 1 \quad \text{FORMULA(1)}$$

$$\text{(Amount of variation at } Tup) = \frac{(Tup - 20 \text{ ns}) \text{ at } 40.96 \text{ }\mu s}{(Tup - 20 \text{ ns}) \text{ at } 20 \text{ ns}} - 1 \quad \text{FORMULA(2)}$$

$$(\Delta \text{ mark}) = \text{FORMULA (1)} - \text{FORMULA (2)} \quad \text{FORMULA(3)}$$

It is clearly noted from FIG. 10 that the conventional construction of FIG. 1 had a delay variation of 8.65%.

The construction of FIG. 4 having the well region 2 expanded to directly below the projecting part 9a of the gate electrode 9, the construction of FIG. 5 having the well region 2 expanded to directly below the source electrode 7 and the drain electrode 8, and the construction of FIG. 6 having the well region 2 combining the patterns of well region in the constructions of FIG. 4 and FIG. 5 invariably had delay variations equivalent to the delay variation of the conventional construction. This fact indicates that the expansion of the well region 2 brought about no effect.

When the well region 2 was expanded to outside the source electrode 7 and the drain electrode 8 as in the construction of FIG. 7, this expansion of the well region brought about a slightly discernible effect. Even in this case, the delay variation was 4.80%, a value denying the occurrence of a fully satisfactory reduction of delay variation.

Further, the construction of FIG. 8 having the contact region between the source electrode 7 and the well region 2 enlarged for the purpose of stabilizing the potential of the well region 2 and the construction of FIG. 9 having the contact region 10 formed in the well region 2 contacting the source electrode 7 had delay variations on a par with the delay variation of the conventional construction.

The constructions of FIG. 2 and FIG. 3, both according to this invention, had delay variations of 1.72% and 1.75%, the values notably small as compared with those of the conventional construction and the comparative construction. This fact clearly indicates that the constructions of the present invention were highly satisfactory.

From the results given above, it is clearly noted that in the constructions of FIG. 4 and FIG. 6, the expansion of the well region 2 to directly below the projecting part of the gate electrode, the source and drain regions, and the source and drain electrodes had absolutely no effect on delay variation and that in the construction of FIG. 7, the expansion of the well region exclusively to outside the source and drain electrodes with the projecting part of the gate electrode left intact brought about no conspicuous effect.

The results obtained of the constructions of FIG. 8 and FIG. 9 indicate that the elaborate stabilization of the potential of the well region produced absolutely no improvement in delay variation.

It is understood that the formation of the well region to the outer side of the projecting part of the gate electrode, the source and drain regions, and the source and drain electrodes as in the constructions of FIG. 2 and FIG. 3 alone is capable of manifesting an effect on the delay variation.

The principle that governs the effect manifested by the constructions of FIG. 2 and FIG. 3 in reducing the delay variation has not yet been explained. It is inferred, however, that the delay variation is caused because the gate field applied to the projecting part 9a of the gate electrode varies the potential of the compound semiconductor layer outside the channel region and consequently induces a variation of instable carriers positioned in the compound semiconductor layer.

Specifically, it is considered that while the construction of FIG. 7 inevitably exerts an inherent effect on the instable carriers existent in the compound semiconductor layer outside the well region because the projecting part of the gate electrode is formed also on the compound semiconductor layer outside the well region, the constructions of FIG. 2 and FIG. 3 can realize the high quality mentioned above because the projecting part of the gate electrode is enclosed with the well region and consequently the application of the gate field to the instable carriers in the compound semiconductor layer outside the well region is repressed.

Incidentally, as concerns the source and drain electrodes, the parts thereof kept in direct contact with the compound semiconductor layer produce the same phenomenon as the projecting part of the gate electrode. By enclosing these parts with the well region in the same manner as the projecting part of the gate electrode, therefore, the main cause for the delay variation is alleviated.

Figure 24:
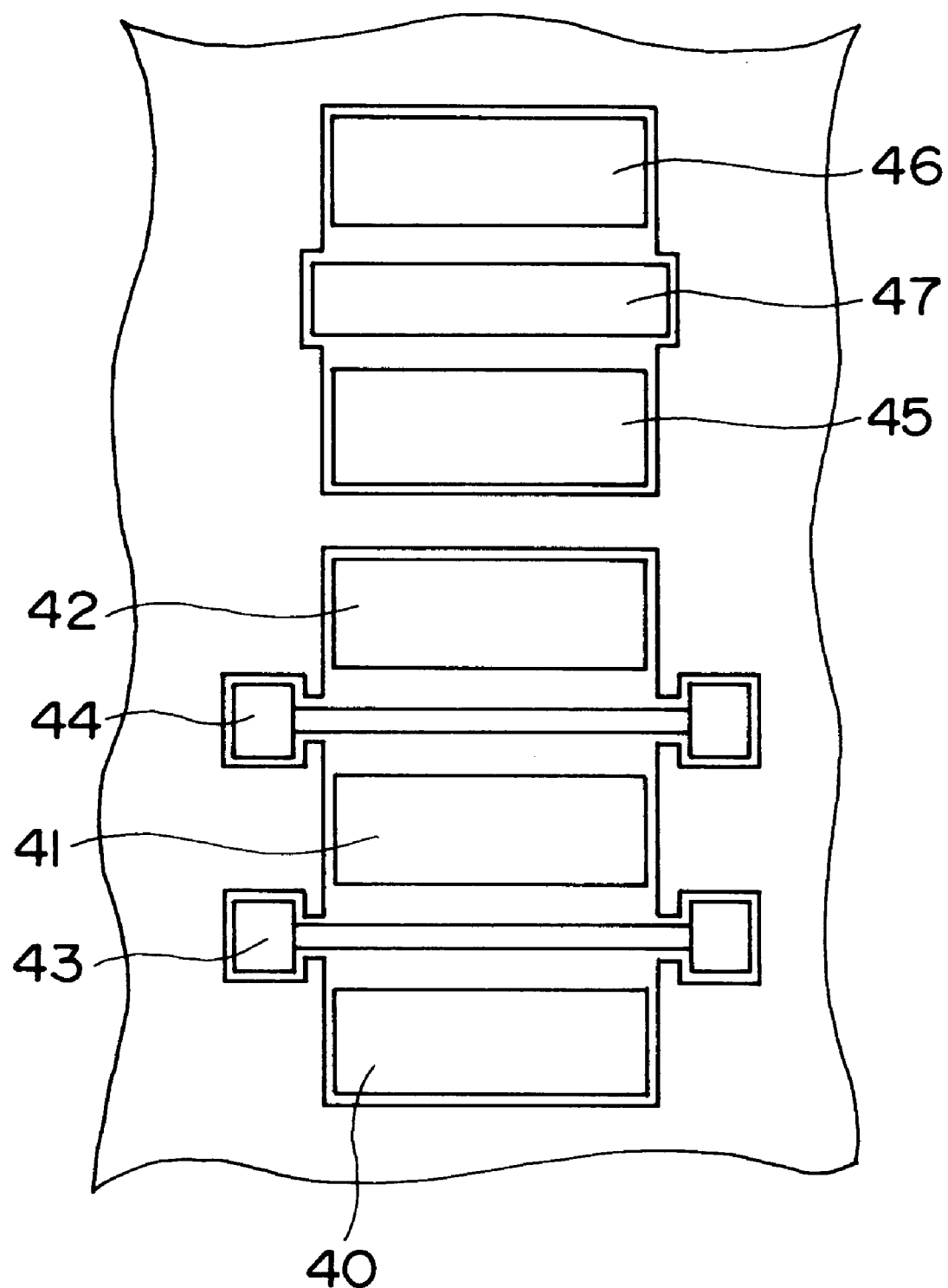
FIG. 24 is a plane view illustrating the construction of one basic cell in the semiconductor integrated circuit device shown in FIG. 23.

The constructions of FIG. 2 and FIG. 3 have the well region formed so as to embrace the outside of the gate pad part. Since this region normally has no marked effect on the operation of the field effect transistor, it is considered that the effect of this invention is not affected by the failure to expand the well region so much as to embrace the gate pad part. Of course, when the gate pad part cannot be formed due to a particular type of construction, it suffices to form the well region in such a manner as to embrace only the portion of the projecting part of the gate electrode that occurs in the region affecting the operation of the transistor. FIG. 24, which will be described specifically hereinafter illustrates one embodiment of this invention in a field effect transistor so constructed as to exclude a gate pad part.

In FIG. 2, the well region is depicted in such a shape as is obtained by copying in a magnified size the peripheral shape of the region of a field effect transistor. It does not need to be limited to this shape. It may be in a tetragonal shape or a triangular shape capable of covering the entire region of a field effect transistor. What is essential is the fact that the electrodes in the part not substantially contributing to the operation of the field effect transistor should be enclosed with the well layer (embedded layer) having a conductivity type opposite to that of the channel layer. The impurity concentration in the part of the well layer enclosing the electrodes therewith is equal to or higher than that in the part of the well layer underlying the channel layer.

The constructions of FIG. 2 and FIG. 3 are each provided with the LDD region 4. This region is not essential for this invention. The omission of this region brings about no alteration in the effect of this invention.

Incidentally, the projecting part of the gate electrode generally protrudes not less than 0.5 $\mu$m from the channel region. This fact is appropriate for ensuring stable control of the channel.

In the first embodiment of this invention described above, the distance from the boundary of the well region to the region of the projecting part of the gate electrode is appropriately not less than 0.3 $\mu$m. This distance is intended to stabilize the compound semiconductor layer (the region in which instable carriers exist) by further decreasing the gate potential which is applied to the compound semiconductor layer. In consideration of the allowance for the registration of the mask during the course of manufacture of the field effect transistor, it is appropriate to give this distance the value of [0.3 μm+allowance for registration (0.2–0.5 μm)] at the time of design.

The compound semiconductor layer may be a compound semiconductor substrate, or be what is provided on a separately prepared compound semiconductor substrate.

When the channel is formed of an n type semiconductor, the source and drain regions must be similarly formed in an n type and the well region in a p type. By the same token, when the channel is formed of a p type semiconductor, the source and drain regions must be similarly formed in a p type and the well region in an n type.

Further, the well region may be stabilized by having connected thereto a source electrode adapted to be retained at a prescribed potential or a separately formed electrode of a fixed potential (such as, for example, a grounding potential). Otherwise, it may form a portion destined to serve as a contact region by introducing an impurity at a high concentration for the purpose of reducing the contact resistance with such an electrode as mentioned above.

Figure 12A:
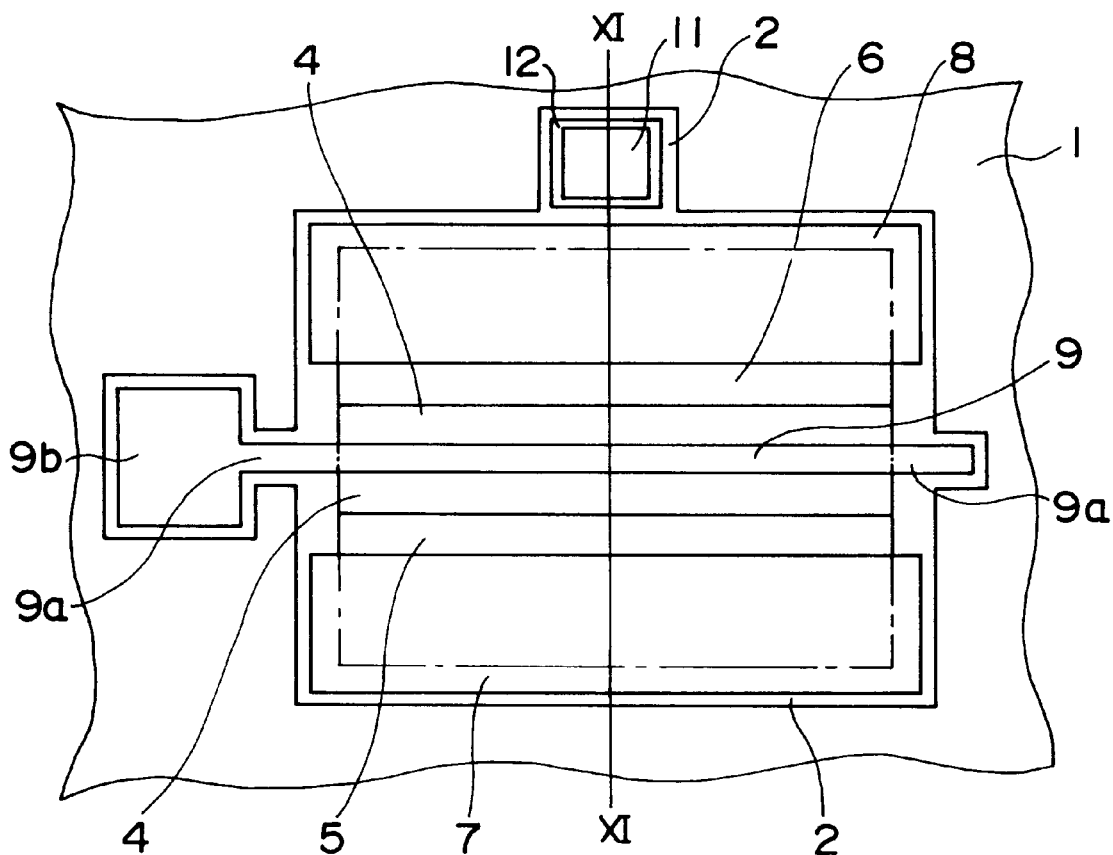
FIG. 12A is a plane view for explaining the construction of a field effect transistor according to the third embodiment of this invention and FIG. 12B is a cross section taken through FIG. 12A along the line XI—XI.
Figure 12B:
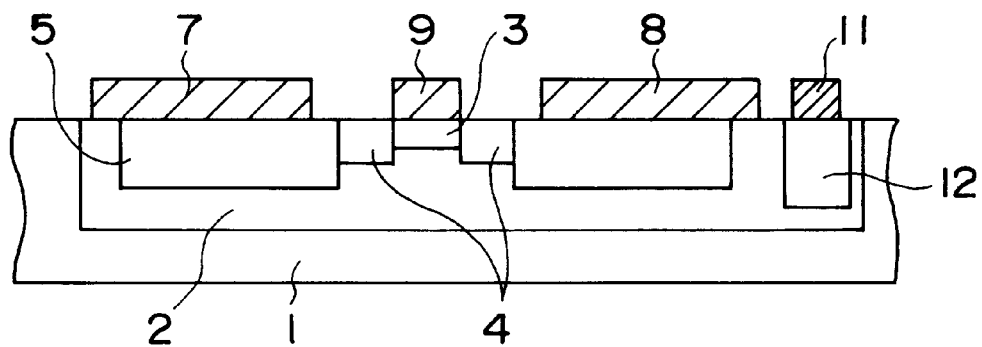

An embodiment according to this description is illustrated in FIG. 12 (third embodiment). FIG. 12A is a plane view and FIG. 12B is a cross section taken through FIG. 12A along the line XI—XI. This embodiment is characterized by the fact that a field effect transistor constructed as illustrated in FIG. 2 is further provided with a potential-imparting electrode 11 adapted to retain the well region 2 at a prescribed potential. Directly below the electrode 11, a $p^+$ region 12 is formed by having incorporated therein a p type impurity at a high concentration. This $p^+$ region 12 forms an ohmic contact with the electrode 11. Generally, the electrode 11 is connected to a ground potential.

Since the source electrode is mainly grounded, it suffices simply to connect the source electrode electrically to the well region. The constructions of FIG. 8 and FIG. 9 likewise seek to stabilize the well region. They nevertheless fail to produce any effect of the sort contemplated by this invention because the well region is not formed so amply as to embrace even the outside of the projecting part of the gate electrode. Meanwhile, this invention seeks to stabilize the potential in the well region by adopting the construction mentioned above for the reason of preventing the influence of the potential applied by the projecting part of the gate electrode from reaching the compound semiconductor layer to the fullest possible extent.

Figure 13A:
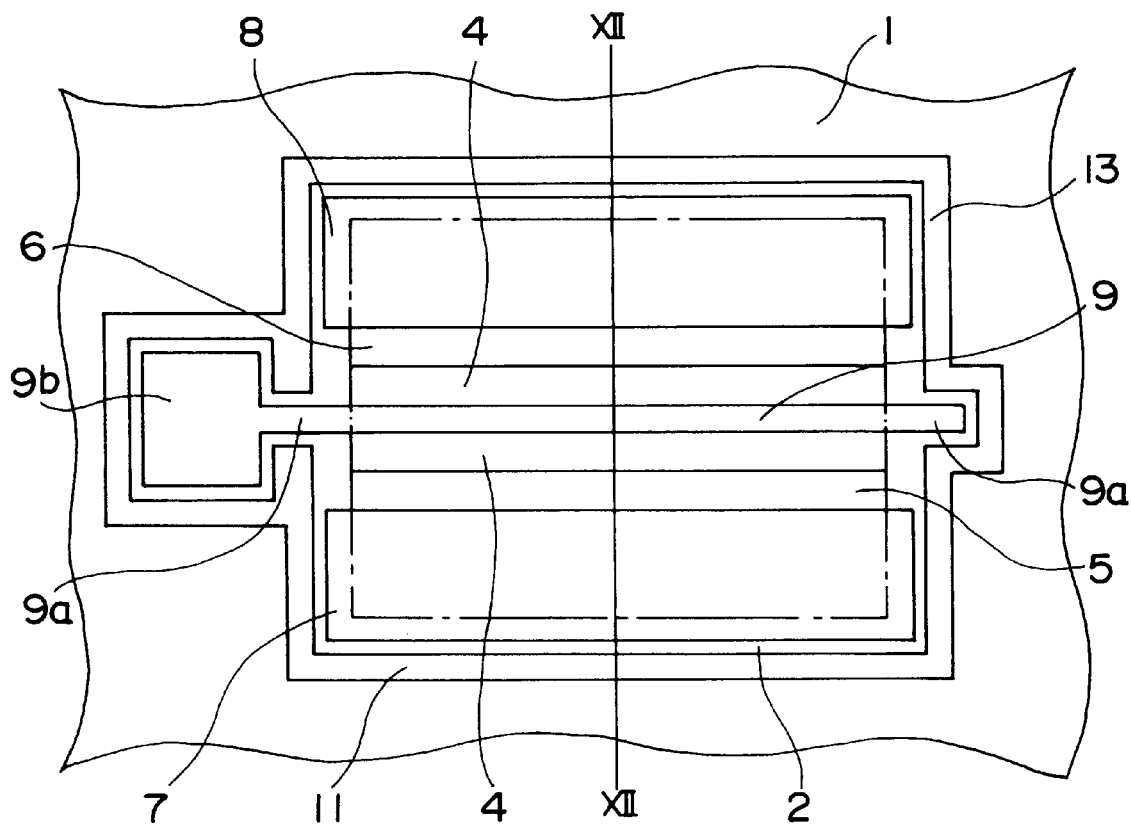
FIG. 13A is a plane view for explaining the construction of a field effect transistor according to the fourth embodiment of this invention and FIG. 13B is a cross section taken through FIG. 13A along the line XII—XII.
Figure 13B:
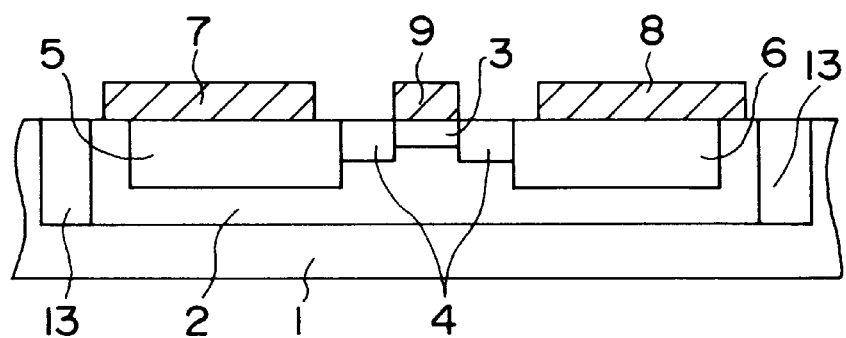

Incidentally, it is allowable to form outside the well region defined by this invention a region having the same conductivity type as the well region and a higher concentration than the well region as an element separating region. FIG. 13 is a diagram illustrating the fourth embodiment of this invention, namely a construction having an element separating region 13 formed along the periphery of the well region 2. This construction is identical with the construction of FIG. 2 except for the element separating region 13. It is clearly noted from FIG. 10 that the construction of FIG. 13 is likewise capable of reducing the delay variation to 1.70%, a value on a par with (or slightly improved over) those obtained in the constructions of FIG. 2 and FIG. 3.

When a logic circuit, for example, is configured by integrating a plurality of field effect transistors according to this invention, it can be operated at a fast timing because the delay variation is significantly reduced. In this case, those of the individual transistors which are connected in parallel and allowed to share an output may share well regions within the relevant compound semiconductor layers. When the individual field effect transistors are connected in series, however, it is proper for the well regions thereof to be electrically separated because the individual transistors produce different outputs.

FIG. 14 is a plane view of a field effect transistor according to the fifth embodiment of this invention, namely a construction having two transistors connected in parallel through the medium of a drain electrode 8 to which an output terminal (not shown) is to be connected. In the present embodiment, since the two transistors share outputs, the relevant well regions 2 are interconnected within a compound semiconductor substrate.

FIG. 15 through FIG. 21 are cross sections to aid in the description of a process for the production of the field effect transistor of the fifth embodiment of the invention. While FIG. 14 illustrates only one of the pair of transistors, the other transistor is produced in parallel through the same process.

Now, the process for producing a field effect transistor of the construction of FIG. 14 will be described below with reference to the cross sections of FIG. 15 through FIG. 21 jointly depicting a process flow.

Figure 15:
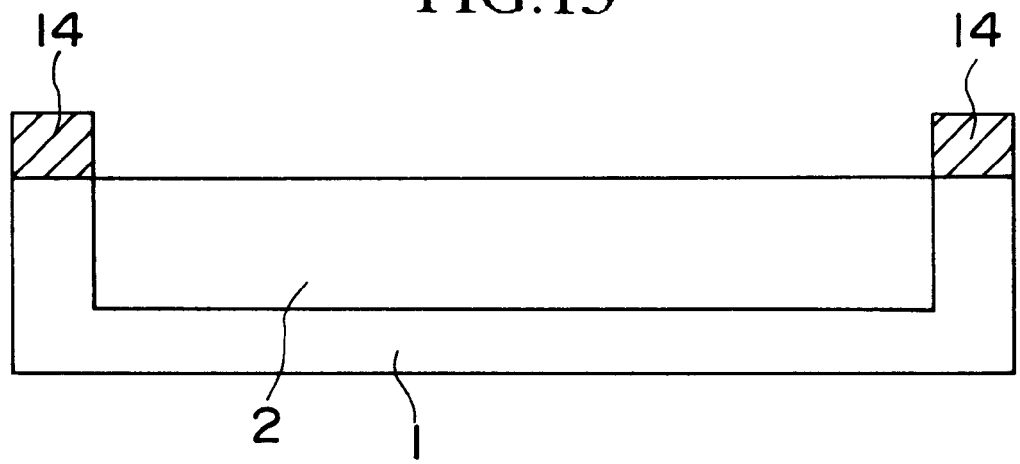
FIG. 15 is a cross section showing the first step in a process for the production of a field effect transistor according to the fifth embodiment of this invention.

(Step of FIG. 15)

The present embodiment utilizes the surface layer of a compound semiconductor substrate as the compound semiconductor layer 1. As illustrated in FIG. 15, a mask 14 is selectively formed on the compound semiconductor layer 1 and the well region 2 is formed by ion injecting a p type impurity through this mask. The mask 14 has a shape identical with the shape of the well region 2 illustrated in FIG. 14, because this well region 2 is required to be formed in such a manner as to enclose therewith the outer sides of the gate electrode, LDD region, source and drain regions, and source and drain electrodes to be formed subsequently. The size of the well region 2 is decided by taking into consideration the allowance for registration of the masks to be formed afterward.

The details of the component parts of the construction are as follows.

Compound semiconductor substrate: Semi-insulating GaAs
Compound semiconductor layer 1: Semi-insulating GaAs
Mask 12: Photoresist
Well region 2:
Impurity: Mg (p type impurity)
Acceleration energy: 150–250 (KeV)
Dose: $1.0 \times 10^{12} – 2.0 \times 10^{12}$ (cm$^{-2}$)

Figure 16:
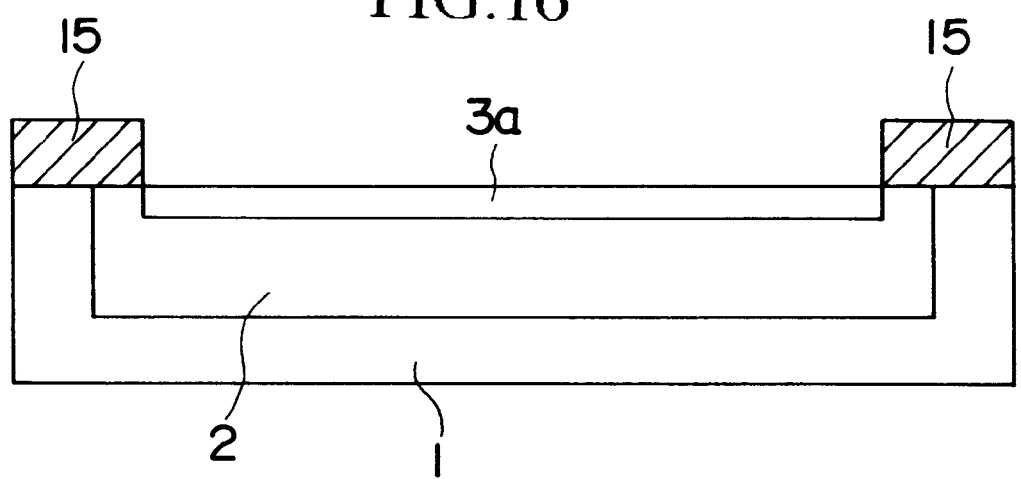
FIG. 16 is a cross section showing the second step in a process for the production of a field effect transistor according to the fifth embodiment of this invention.

(Step of FIG. 16)

After the mask 14 of FIG. 15 has been removed, a mask 15 for defining portions destined to form a source, a drain, an LDD, and a channel region is newly formed. A first n type region 3a is formed by ion injecting an n type impurity through the mask 15.

Incidentally, it is only directly below the gate electrode to be subsequently produced that is actually destined to form the channel region. In the present embodiment, however, the incorporation of the impurity is carried out simultaneously in the portions destined to form the source region, the drain region, and the LDD region subsequently.

Mask 15: Photoresist
First n type region 3a (inclusive of the channel region 3):
Impurity: Si (n type impurity)
Acceleration energy: 30–50 (KeV)
Dose: $3.0 \times 10^{12} – 7.0 \times 10^{12}$ (cm$^{-2}$)

Next, the semiconductor substrate in the state of FIG. 16 is annealed in an atmosphere of an inert gas such as nitrogen. The annealing is effected at a temperature of about 800° C. for a period of about 20 minutes.

Figure 17:
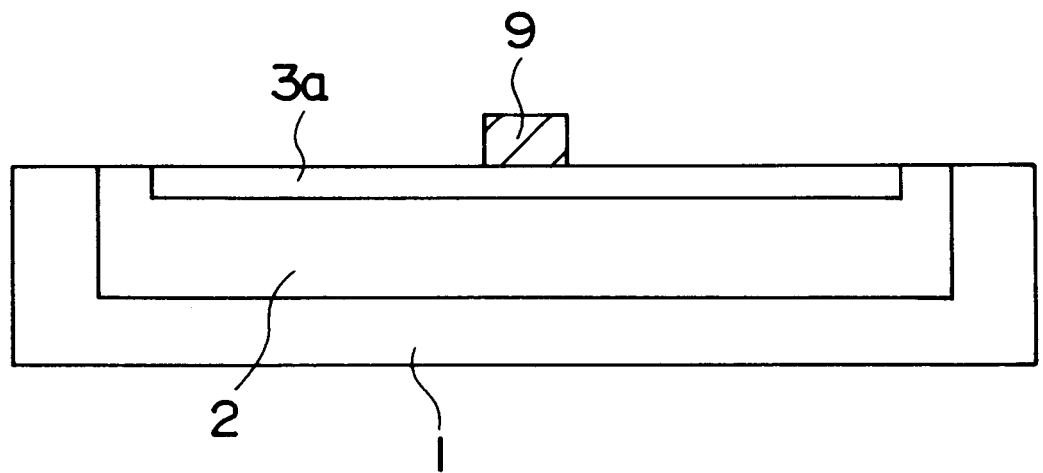
FIG. 17 is a cross section showing the third step in a process for the production of a field effect transistor according to the fifth embodiment of this invention.

(Step of FIG. 17)

After the mask 15 of FIG. 16 has been removed, the exposed substrate is cladded with a gate electrode material. A gate electrode 9 is formed by selectively etching the gate electrode material through a mask (not shown.) The portion directly below the gate electrode constitutes itself the part which actually operates as a channel.

The details of the gate electrode 9 are as follows.

Gate electrode 9:

Material: WSi

Thickness: 4500 (Angstroms), properly in the approximate range of 3000–5000 (Angstroms)

Gate length: 0.6 μm (for example)

Method of fabrication: Reactive ion etching (RIE)

Figure 18:
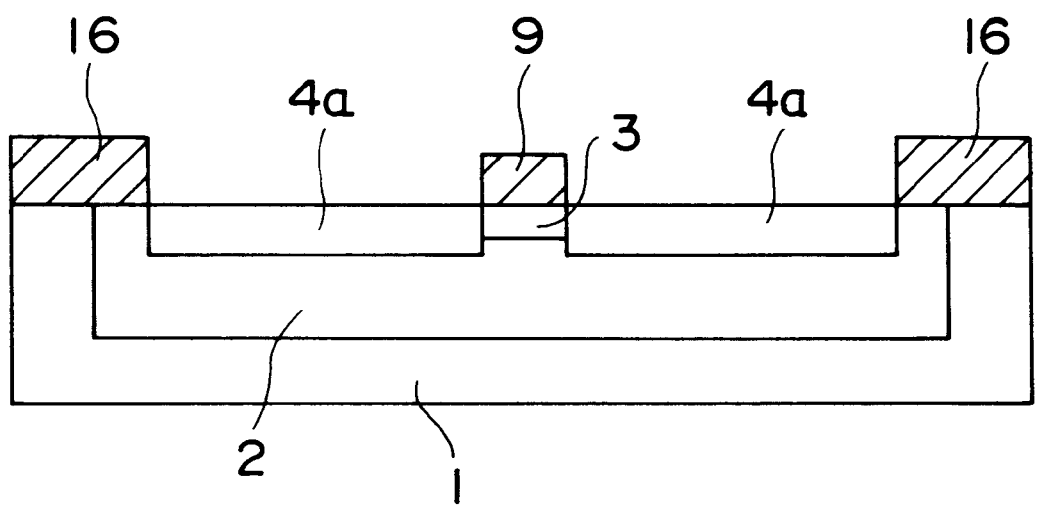
FIG. 18 is a cross section showing the fourth step in a process for the production of a field effect transistor according to the fifth embodiment of this invention.

(Step of FIG. 18)

A mask 16 is newly formed. A second n type region 4a is formed by ion injection an n type impurity through this mask 16 and the gate electrode 9 as an improvised mask.

It is the part intervening between the channel region 3 and the source region and the drain region that actually constitutes the LDD region 4. In the present embodiment, the incorporation of the impurity is effected simultaneously in the parts destined to form the source region and the drain region.

The details of the second n type region 4a are as follows.

Region 4a (inclusive of the LDD region 4):

Impurity: Si (n type impurity)

Acceleration energy: 40–80 (KeV)

Dose: $1 \times 10^{13}$ (cm$^{-2}$)

Figure 19:
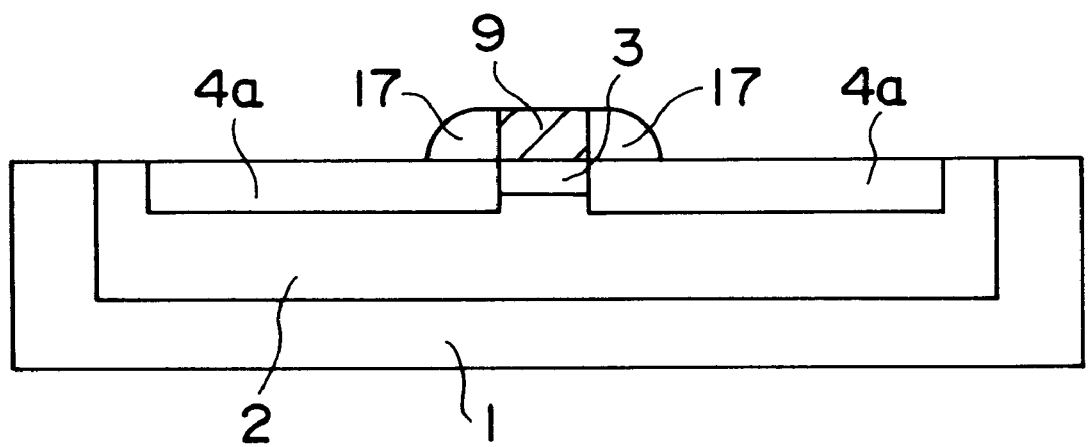
FIG. 19 is a cross section showing the fifth step in a process for the production of a field effect transistor according to the fifth embodiment of this invention.

(Step of FIG. 19)

After the mask 16 of FIG. 18 has been removed, the exposed substrate is cladded throughout the entire surface with an insulating film formed of silicon dioxide. The deposited film is then etched in a vertical direction to give rise to a lateral wall insulating film 17 on either side of the gate electrode. The regions directly below the lateral wall insulating films 17 (the region denoted by the reference numeral 4) are destined to constitute themselves the parts for functioning as LDD afterward.

The details of the wall insulating film 17 are as follows.

Lateral wall insulating film 17:

Material: Silicon dioxide

Method of fabrication: Reactive ion etching (RIE)

Figure 20:
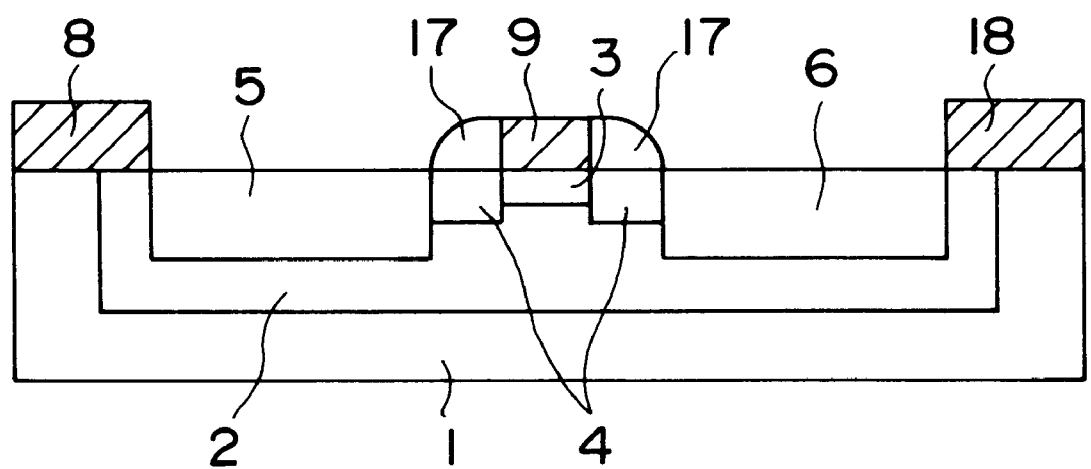
FIG. 20 is a cross section showing the sixth step in a process for the production of a field effect transistor according to the fifth embodiment of this invention.

(Step of FIG. 20)

A mask 18 is newly formed. The source region 5 and the drain region 6 are formed by ion injecting an n type impurity through the mask 18 and the gate electrode 9 and the lateral wall insulating film 17 as improvised masks.

The details of the source and drain regions are as follows.

Source region 5 and drain region 6:

Impurity: Si (n type impurity)

Acceleration energy: 100 (KeV)

Dose: $3 \times 10^{13}$ (cm$^{-2}$)

After the source and drain regions have been formed, the substrate is annealed in an atmosphere of an inert gas such as nitrogen. The annealing is performed at a temperature of about 750° C. for a period of about 20 minutes.

Figure 21:
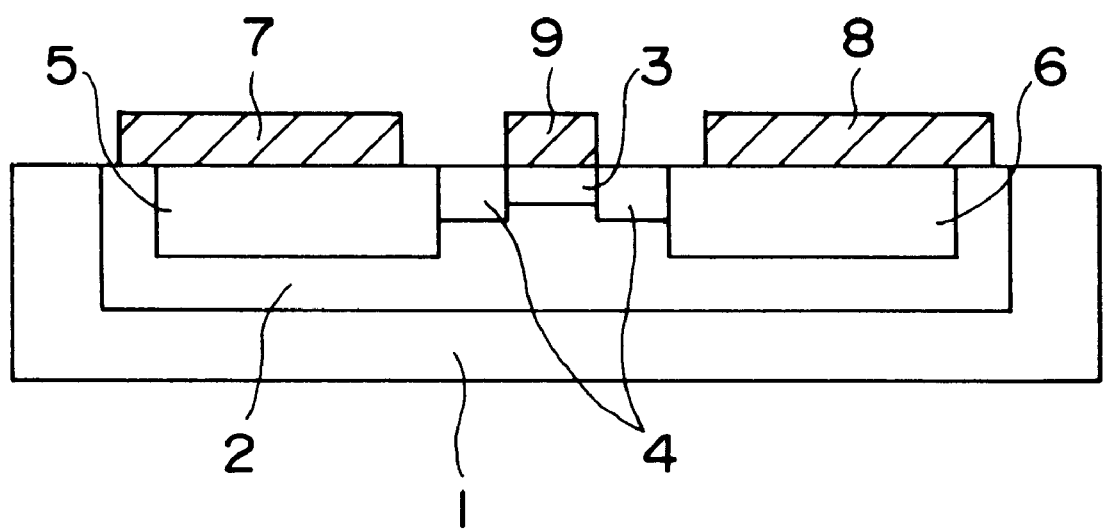
FIG. 21 is a cross section showing the seventh step in a process for the production of a field effect transistor according to the fifth embodiment of this invention.

(Step of FIG. 21)

After the lateral wall insulating films on both sides of the gate electrode 9 have been removed, the parts overlying the source and drain regions are selectively opened. For example, a mask pattern (not shown) is formed of photoresist and the exposed substrate is cladded with an electrode material as by the technique of vacuum deposition. Then, the source electrode 7 and the drain electrode 8 are selectively formed by the liftoff method which comprises removing the mask pattern and simultaneously removing the electrode material on the mask pattern.

The details of the source and drain electrode are as follows.

Source electrode 7 and drain electrode 8:

Material: AuGe/Ni/Au

Thickness: 3000 (Angstroms) altogether

After the electrodes have been formed, they are annealed in the atmosphere of an inert gas such as nitrogen to alloy the electrode metal. The annealing is performed at a temperature of about 500° C. for a period of about 2–3 minutes.

In the field effect transistor of the present embodiment produced by the process described above, the gate electrode, the LDD region, the source and drain regions, and the source and drain electrodes are formed inside the well region and the instable carriers in the regions jointly operating as a transistor are repressed. Thus, the field effect transistor is capable of reducing the delay variation to a small value.

According to the present embodiment, therefore, erroneous operation due to a delay variation can be eliminated even when the speed of operation is heightened and higher speed circuit operation can be attained.

In the present embodiment, the channel is formed in an n type and the well region is consequently formed in a p type. Of course the conductivity types may be reversed, i.e. the well region may be formed in an n type and the channel, the LDD region, and the source and drain regions in a p type.

In the production of the field effect transistor of the first embodiment of this invention, no special step is required to be added to the process of steps illustrated in FIG. 15 through FIG. 21. The component steps of the process after the step of FIG. 15 can be adopted with necessary modifications, except the mask pattern for forming the well region is given the shape of the well region 2 illustrated in FIG. 2. In the production of the field effect transistor according to the second embodiment of this invention, it suffices to add to the compound semiconductor layer an impurity of an opposite conductivity type. The step for selectively forming the well region is no longer necessary. To be specific, a p type impurity, for example, is added to the compound semiconductor layer 1 which is formed of semi-insulating GaAs so that this layer itself may function as a well region. For this purpose, it suffices to inject Mg as the impurity into the compound semiconductor layer 2 until the concentration of the purity therein reaches a level in the range of $1.0 \times 10^{12}$–$2.0 \times 10^{12}$ (cm$^{-2}$). After the compound semiconductor layer 1 mentioned above has been formed as described above, the process following the step of FIG. 16 (after the step for the formation of the channel region) is to be carried out.

Figure 22:
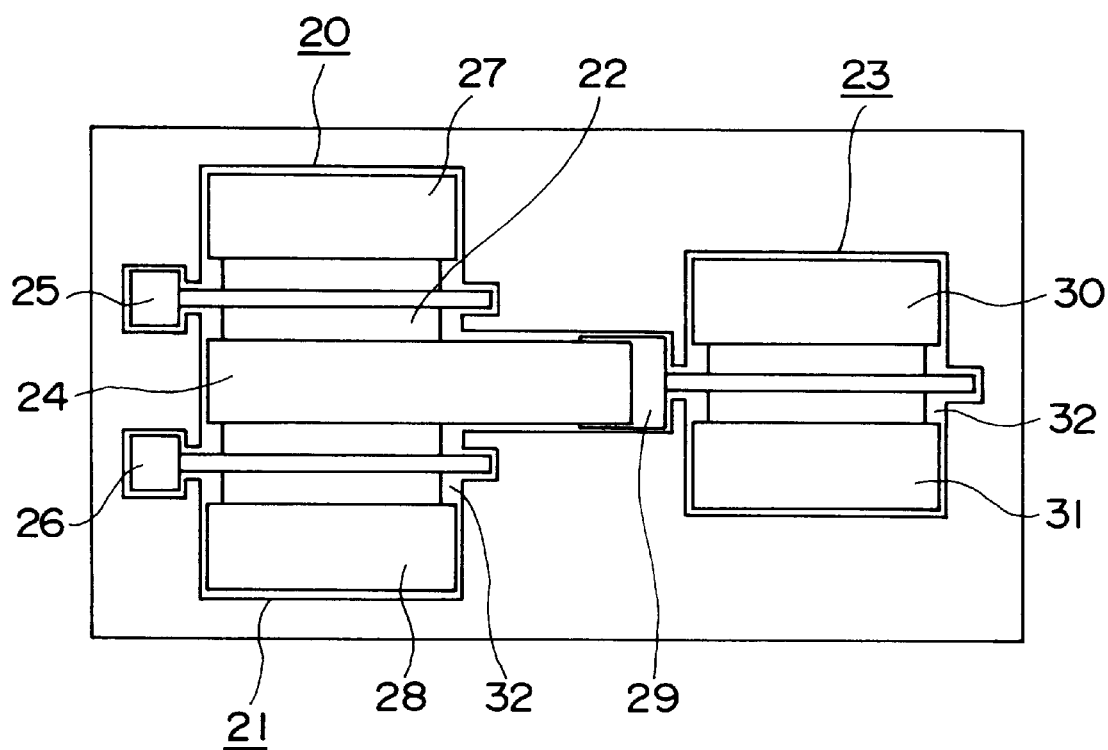
FIG. 22 is a plane view illustrating the construction of a field effect transistor according to the sixth embodiment of this invention.

The fifth embodiment is depicted as a case of realizing a parallel circuit of two transistors. These two transistors, when necessary, may be used otherwise in the form of a series circuit in accordance with this invention. FIG. 22 is a plane view of a field effect transistor according to the sixth embodiment of this invention, namely a construction such that two transistors 20 and 21 may be connected in series while sharing a region 22 that functions as a source region for the one transistor 20 and a drain region for the other transistor 21. On the region 22 is formed a common electrode 24 that functions as a source electrode for the transistor 20 and a drain electrode for the transistor 21.

In the diagram, numeral 25 represents a gate electrode of the transistor 20, 26 for a gate electrode for the transistor 21, 27 is a drain electrode for the transistor 20, 28 is a source electrode for the transistor 21, 29 is a gate electrode for a transistor 23, 30 for a drain electrode, and 31 is a source electrode of the transistor 23. In this embodiment, a well region 32 is formed in such a manner as to enclose therewith the channel, the source and drain regions, and the projecting parts of the electrodes.

In the series circuit, there are times when the outputs of the component transistors are different. It, therefore, possibly proves more appropriate for the component transistors in the series circuit to use independent well regions than to share well regions as in the present construction. Of course, even in the construction of FIG. 14 using a series circuit, the well regions of the component transistors may be formed as separated from one another.

Though the fifth and sixth embodiments described above do not form the element separating region 13 of the kind illustrated in FIG. 13, they are allowed, when necessary, to have a p type (when the well region is in the p type) element separating region of a high concentration formed in a circuit leading to other element.

FIG. 23A is a diagram illustrating the seventh embodiment of this invention, namely a plane view of a cell array formed with field effect transistors according to this invention. FIG. 23B is a partially magnified diagram of the cell array. In the diagram, numeral 32 stands for a basic cell array, 33 is an input/output cell, and 34 is an input/output pad.

One basic cell in the basic cell array 32 is composed of three field effect transistors as shown in FIG. 24. In FIG. 24, 40 is a source electrode in the first transistor, 41 is a common electrode, i.e. concurrently for a drain electrode in the first transistor and a source electrode in the second transistor, 42 is a drain electrode in the second transistor, 43 and 44 are gate electrodes respectively in the first and the second transistor, and 45 is a source electrode numeral 46 is a drain electrode, and 47 is a gate electrode respectively in the third transistor.

Figure 23:
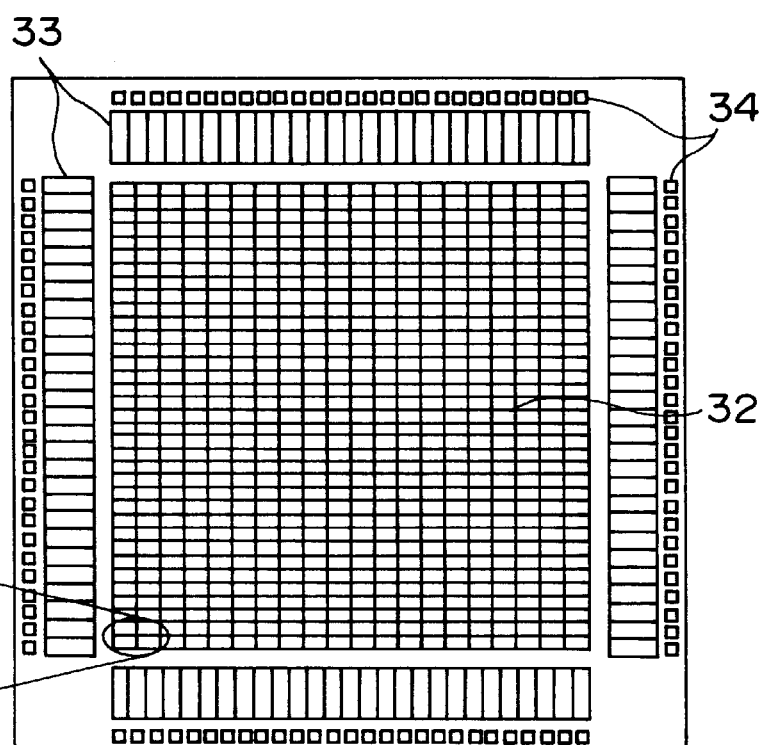
FIG. 23A is a plane view illustrating the construction of a semiconductor integrated circuit device according to the seventh embodiment of this invention and FIG. 23B is a partly magnified diagram thereof.

In the cell array of FIG. 23, the component basic cells are so arrayed that the individual cells in the adjacent rows and columns may fall symmetrically across their boundaries. The magnified diagram schematically depicts the layout relation of four mutually adjoining basic cells. In the diagram, the symbol F in each basic cell 35 is intended to show the relation of symmetry between the adjacent cells.

The cell array using a considerable number of field effect transistors according to this invention as illustrated in FIG. 23 manifests a significant effect where the whole of cells is required to operate at a high speed because the delay variation in each of the transistors can be reduced to a small magnitude.

In the various embodiments described above, the compound semiconductor layer 1 is formed with semi-insulating GaAs. The present invention, however, is characterized by manifesting the same effect even when the field effect transistor is formed with other compound semiconductor types such as, for example, InP.

In the first embodiment of this invention illustrated in FIG. 2, the well region even covers the outer side of the source and drain regions. As a known publication concerning this specific construction, IEEE JOURNAL OF SOLID-STATE CIRCUITS, VOL. 25, No. 6, p 1544–p 1549 "A p-Well GaAs MESFET Technology for Mixed-Mode Applications" published in December, 1990, may be referred to.

Though this prior publication only carries a cross section (FIG. 8) taken in the direction of length of a gate, it shows a region labeled as "p-well." Since this region is located at the same position as the well region involved in the present invention, the construction appears to resemble the construction of the present invention. The construction of this prior publication, however, aims to electrically separate the channel region as from the wiring (side gate) by enclosing the channel region with the p-Well (well region). The prior publication makes no mention of such formation of a projecting part in a gate electrode as contemplated by the present invention and gives absolutely no consideration to the influence exerted by the projecting part on the compound semiconductor layer.

In short, since the construction of this prior publication aims to attain electric isolation of the channel region, it is only required to enclose the channel region selectively with the well region and it has no reason for enclosing even the projecting part of the gate electrode with the well region. It is, therefore, logical to conclude that the construction and the effect of what is disclosed in the prior publication are on a par with those of FIG. 7.

JP-A-03-104,239 dated May 1, 1991 discloses a technique for forming a well region below a wiring. Unlike this invention which has been described above, this technique does not resides in forming a well region in the region of a field effect transistor itself. Thus, this prior patent publication does not suggest, let alone disclose, the present invention.

As a prior publication concerning the formation of a well region in the region of a field effect transistor itself, JP-A-58-56,471 dated Apr. 4, 1983 may be referred to. Though this prior patent publication indeed discloses a technique for forming a well region in such a manner as to enclose therewith the peripheries of a source electrode and a drain electrode, the gate electrode is not enclosed with the well region. Further, since the well region has the same n type conductivity as the channel region, it may well be concluded that the technique under discussion has absolutely no relation with the present invention.

According to the present embodiment, since the delay variation is reduced to a low level, erroneous operation due to any delay variation can be eliminated even when the speed of operation is heightened and, consequently, higher speed circuit operation can be attained higher speed. This fact means that the present invention can realize the expeditiousness which is inherent in a field effect transistor using a compound semiconductor. The effect of the expeditiousness is significant particularly in a logic circuit which is expected to operate at a high speed.

What is claimed is:

1. A field effect transistor, comprising:

a compound semiconductor layer;

a channel region of a first conduction type formed in said compound semiconductor layer;

a source and a drain regions of said first conduction type formed in said compound semiconductor layer opposite each other across said channel region;

a gate electrode formed on said channel region, extended in a direction crossing a source and drain region direction, and provided with a projecting part protruding from said channel region in a horizontal plane;

a source and a drain electrodes electrically connected to said source and drain regions; and a well region of a second conduction type opposite to said first conduction type, formed in said compound semiconductor layer, adapted to enclose therewith said channel region, said source and drain regions, and the projecting part of said gate electrode, and formed in a depth greater than said channel and said source and drain regions.

2. The field effect transistor according to claim 1, wherein said gate electrode is provided with a gate pad part having a width greater than that of said gate electrode.

3. The field effect transistor according to claim 2, wherein said well region is formed so as to enclose said gate pad part.

4. The field effect transistor according to claim 1, wherein said source and drain electrodes have parts projecting out of said source and drain regions and said well region is formed so as to enclose therewith said projecting parts.

5. The field effect transistor according to claim 4, wherein the distance between a boundary of said well region and said channel region, said source and drain regions, and a region of the projecting part of said gate electrode is not less than 0.3 µm.

6. The field effect transistor according to claim 5, wherein said distance is larger than the total of 0.3 µm plus a mask alignment margin.

7. The field effect transistor according to claim 1, wherein the projecting part of said gate electrode protrudes not less than 0.5 µm from the boundary of said channel region.

8. The field effect transistor according to claim 1, wherein said compound semiconductor layer is formed on a semi-insulating compound semiconductor substrate.

9. The field effect transistor according to claim 1, wherein said well region is of a p type and said channel, source, and drain regions are of an n type.

10. The field effect transistor according to claim 1, wherein said well region is of an n type and said channel, source, and drain regions are of a p type.

11. The field effect transistor according to claim 1, wherein said well region has connected thereto a potential-imparting electrode for imparting a prescribed potential.

12. The field effect transistor according to claim 11, wherein an area to which said potential-imparting electrode is connected has incorporated therein an impurity of said second conductivity type at a concentration higher than in said well region.

13. The field effect transistor according to claim 11, wherein said prescribed potential-imparting electrode is connected to a ground potential.

14. The field effect transistor according to claim 1, wherein said channel region has two LDD regions, one of said LDD regions being formed between said source electrode and said gate electrode, and another of said LDD regions being formed between said drain electrode and said gate electrode, said LDD regions have incorporated therein an impurity of said first conduction type having impurity concentration higher than that in the channel region directly below said gate electrode and lower than that in said source and drain regions.

15. The field effect transistor according to claim 1, wherein said well region is provided in the periphery thereof with an element separating region having the same conductivity type as said well region and a higher concentration than said well region.

16. A semiconductor integrated circuit device having integrated in a compound semiconductor layer thereof a plurality of field effect transistors each comprising:

a) a channel region of a first conduction type formed in said compound semiconductor layer;

b) a source and a drain regions of said first conduction type formed in said compound semiconductor layer opposite each other across said channel region;

c) a gate electrode formed on said channel region, extended in a direction crossing a source and drain region direction, and provided with a projecting part protruding from said channel region in a horizontal plane;

d) a source and a drain electrodes electrically connected to said source and drain regions; and e) a well region of a second conduction type opposite to said first conduction type, formed in said compound semiconductor layer, adapted to enclose therewith said channel region, said source and drain regions, and the projecting part of said gate electrode, and formed in a depth greater than said channel and said source and drain regions.

17. The semiconductor integrated circuit device according to claim 16, wherein some transistors of said plurality of integrated field effect transistors form a common output circuit, said some transistors having well layers thereof interconnected within compound semiconductor layers thereof.

18. The semiconductor integrated circuit device according to claim 16, wherein said plurality of field effect transistors are connected in series.

19. The semiconductor integrated circuit device according to claim 18, wherein said plurality of series connected field effect transistors have the well regions thereof electrically separated from one another.

* * * * *